United States Patent
Lu et al.

(10) Patent No.: US 12,363,688 B2
(45) Date of Patent: Jul. 15, 2025

(54) DATA TRANSMISSION METHOD AND APPARATUS

(71) Applicant: Huawei Technologies Co., Ltd., Shenzhen (CN)

(72) Inventors: Jianmin Lu, Shenzhen (CN); Fan Wang, Shanghai (CN); Zhang Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 54 days.

(21) Appl. No.: 18/324,560

(22) Filed: May 26, 2023

(65) Prior Publication Data

US 2023/0300900 A1    Sep. 21, 2023

Related U.S. Application Data

(63) Continuation of application No. PCT/CN2021/133082, filed on Nov. 25, 2021.

(30) Foreign Application Priority Data

Nov. 30, 2020 (CN) .......................... 202011380672.1

(51) Int. Cl.
*H04L 27/00* (2006.01)
*H04W 72/044* (2023.01)
*H04W 74/0833* (2024.01)

(52) U.S. Cl.
CPC ..... *H04W 74/0833* (2013.01); *H04W 72/044* (2013.01)

(58) Field of Classification Search
CPC .......... H04W 74/0833; H04W 72/044; H03M 13/251; H03M 13/2906; H03M 13/2927; H03M 13/611; H04L 1/0045; H04L 1/0065; H04L 1/0041; H04L 1/1861
USPC ........................................... 375/259
See application file for complete search history.

(56) References Cited

U.S. PATENT DOCUMENTS 9,923,668 B2    3/2018  Kim et al.
2017/0353959 A1*  12/2017  Xu ....................... H04B 7/0639

FOREIGN PATENT DOCUMENTS

WO    2019025319 A1    2/2019

OTHER PUBLICATIONS

Vamsi K. Amalladinne et al. "A coupled compressive sensing scheme for uncoordinated multiple access", arXiv:1809.04745v1 [eess.SP] Sep. 13, 2018, total 13 pages.
Y. Polyanskiy, "A perspective on massive random-access", IEEE Int. Symp. Inf. Theory (ISIT), Jun. 2017, total 5 pages.

(Continued)

*Primary Examiner* — Helene E Tayong
(74) *Attorney, Agent, or Firm* — Slater Matsil, LLP

(57) ABSTRACT

A method includes: obtaining a first sequence, where the first sequence includes T first subsequences; determining T encoding vectors based on the T first subsequences; generating T second subsequences based on one or more codebooks and the T encoding vectors, where each first subsequence corresponds to one column vector group in the one or more codebooks, and a column vector group corresponding to at least one of the T first subsequences includes at least two column vectors; and sending the T second subsequences.

18 Claims, 12 Drawing Sheets

(56) References Cited

OTHER PUBLICATIONS

Alexander Fengler et al, "SPARCs and AMP for Unsourced Random Access", 2019 IEEE International Symposium on Information Theory (ISIT). IEEE, 2019, total 5 pages.
Wikipedia, "Bloom filter". URL:https://en.wikipedia.org/wiki/Bloom_filter, Apr. 17, 2004, total 26 pages.
Ramji Venkataramanan et al, "Sparse Regression Codes", IEEE Information Theory Society Newsletter, Dec. 2016, total 9 pages.
Alexander Fengler et al, "Unsourced Multiuser Sparse Regression Codes achieve the Symmetric MAC Capacity", arXiv:2001.04217v1 [cs.IT] Jan. 13, 2020, total 7 pages.
Alexander Fengler et al, "SPARCs for Unsourced Random Access", arXiv:1901.06234v1 [cs.IT] Jan. 18, 2019, total 16 pages.

* cited by examiner

DATA TRANSMISSION METHOD AND APPARATUS

CROSS-REFERENCE TO RELATED APPLICATIONS

This application is a continuation of International Application No. PCT/CN2021/133082, filed on Nov. 25, 2021, which claims priority to Chinese Patent Application No. 202011380672.1, filed on Nov. 30, 2020. The disclosures of the aforementioned applications are hereby incorporated by reference in their entireties.

TECHNICAL FIELD

This application relates to the field of communication, and in particular, to a data transmission method and an apparatus.

BACKGROUND

Random access is a critical technical problem in wireless communication, and has a wide range of application scenarios. For example, random access is applied to initial access by a user and contention transmission. In wireless communication, a massive machine type communication (mMTC) service is a very important service scenario, and can enable a plurality of applications with different features. In many mMTC services, there are a large quantity of machine type terminals that may perform communication. However, a machine type communication (MTC) terminal may need to perform transmission only at a few moments. Only a few MTC terminals need to perform transmission at the same time. In addition, a transmitted data packet is mainly a small packet. In such a scenario, if a random access-request-authorization-transmission procedure that is usually used in a communication system such as 4G (4th Generation) is used, because the data packet is small, data transmission efficiency is very low, and a transmission latency is also increased. An efficient method is to use an unlicensed random access solution, and complete data transmission in a random access phase of initial contention. Impact of small-packet data on a conventional solution is that an encoding code length is short, an encoding gain is obviously reduced, and a distance between the encoding code length and a theoretical boundary of Shannon is large.

To resolve these problems, academia has carried out many theoretical studies in recent years. Currently, a good solution is data transmission based on passive random access. In this solution, data modulation, encoding and contention random access are jointly optimized, and good theoretical performance is obtained. Passive random access based on sparse regression code (SPARC)-inspired inner code and tree code is one solution. However, due to a special design of this type of solution, if a sequence in the front is not detected or is incorrectly detected, an entire sequence may not be restored. In addition, for a scenario with an excessively low activation rate, an information transmission rate in this solution is low, and a quantity of codewords is small. In addition, in this solution, a maximum quantity of concurrent activations is limited, and this solution is not applicable to a scenario with a high activation rate.

SUMMARY

This application provides a data transmission method and an apparatus, to resolve problems of low data transmission efficiency and a small encoding gain caused by a small data packet.

According to a first aspect, a data transmission method is provided. The method includes: obtaining a first sequence, where the first sequence includes T first subsequences, and T is a positive integer; determining T encoding vectors based on the T first subsequences, where a quantity of non-zero elements in at least one of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1 \in [1, T]$, and both $t_1$ and T are positive integers; generating T second subsequences based on one or more codebooks and the T encoding vectors, where each first subsequence corresponds to one column vector group in the one or more codebooks, and a column vector group corresponding to at least one of the T first subsequences includes at least two column vectors; and sending the T second subsequences.

In this technical solution, the quantity of non-zero elements in the at least one of the T encoding vectors determined based on the T first subsequences is greater than or equal to 2. The column vector group corresponding to the at least one of the T second subsequences determined based on the codebook and the encoding vector includes the at least two column vectors. In other words, the at least one first subsequence is mapped to the at least two column vectors in the codebook, thereby achieving technical effect of improving codeword space.

With reference to the first aspect, in some implementations of the first aspect, a $t_2^{th}$ second subsequence is obtained by multiplying a codebook $E_{t2}$ by a $t_2^{th}$ encoding vector. The codebook $E_{t2}$ is a matrix with n rows and M columns. The $t_2^{th}$ encoding vector is determined based on a $t_2^{th}$ first subsequence. A length of the $t_2^{th}$ encoding vector is equal to M. $t2 \in [1,T]$. t2, n, and M are all positive integers. The codebook $E_{t2}$ is one of the one or more codebooks.

With reference to the first aspect, in some implementations of the first aspect, any two column vectors in two column vector groups corresponding to any two first subsequences do not overlap with each other.

In this technical solution, one first subsequence is mapped to the at least two column vectors corresponding to the codebook, and the any two column vectors in the column vector group corresponding to the any two first subsequences do not overlap with each other. This can achieve technical effect of increasing redundancy, performing additional protection on the first subsequence, increasing the encoding gain, and improving decoding reliability.

With reference to the first aspect, in some implementations of the first aspect, at least two column vectors in two column vector groups corresponding to any two first subsequences do not overlap with each other.

In this technical solution, one first subsequence is mapped to the at least two column vectors corresponding to the codebook, and the at least two column vectors in the column vector group corresponding to the any two first subsequences do not overlap with each other. This can achieve technical effect of increasing an information rate carried by each first subsequence, expanding codeword space, and increasing a quantity of users that can be accommodated.

With reference to the first aspect, in some implementations of the first aspect, in the T first subsequences, any two column vectors in the column vector group corresponding to $T_1$ first subsequences do not overlap with each other. At least two column vectors in the column vector group corresponding to $T_2$ first subsequences do not overlap with each other.

Any one of $T_1$ to-be-sent sequences and any one of $T_2$ to-be-sent sequences are different sequences. $T=T_1+T_2$.

In this technical solution, a combination of the two different manners can achieve technical effect of enhancing protection for an important first subsequence and improving reliability, and can also achieve technical effect of increasing a transmission rate and adding more users for simultaneous transmission. The combination of the two manners provides function flexibility for overall optimization of system performance.

With reference to the first aspect, in some implementations of the first aspect, one column vector group in the codebook corresponding to each of the T first subsequences is one of c column vector groups. c is a value obtained by rounding up or rounding down M/g. g is a quantity of column vectors in the one column vector group. M is a quantity of columns in the codebook. g is an integer greater than or equal to 1 and less than or equal to M.

With reference to the first aspect, in some implementations of the first aspect, one column vector group in the codebook corresponding to each of the T first subsequences is one of c column vector groups. $c=2^k$. k is a value obtained by rounding up or rounding down $\log_2 p$. p is equal to $C_M^b$. b is a quantity of column vectors in the one column vector group. M is a quantity of columns in the codebook. b is an integer greater than or equal to 1 and less than or equal to M.

With reference to the first aspect, in some implementations of the first aspect, outer-code encoding is performed on an original information sequence to generate the first sequence.

According to a second aspect, a data transmission method is provided. The method includes:

obtaining T second subsequences, where the T second subsequences are generated based on one or more codebooks and T encoding vectors, the T encoding vectors are generated based on T first subsequences, a quantity of non-zero elements in at least one of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1 \in [1, T]$, and both $t_1$ and T are positive integers; and performing inner-code decoding on the T second subsequences based on the one or more codebooks, to obtain the T first subsequences, where each first subsequence corresponds to one column vector group in the one or more codebooks, and a column vector group corresponding to at least one of the T first subsequences includes at least two column vectors.

In this technical solution, inner-code decoding is performed on the T second subsequences based on the one or more codebooks, to obtain the T first subsequences. The column vector group corresponding to the at least one of the T first subsequences includes the at least two column vectors, thereby achieving technical effect of improving codeword space.

With reference to the second aspect, in some implementations of the second aspect, one column vector group in a codebook $E_{t2}$ corresponding to a $t_2^{th}$ first subsequence is determined by detecting a $t_2^{th}$ second subsequence, where $t2 \in [1, T]$, t2 is a positive integer, and the codebook $E_{t2}$ is one of the one or more codebooks. The $t_2^{th}$ first subsequence is determined based on the one column vector group in the codebook $E_{t2}$ corresponding to the $t_2^{th}$ first subsequence.

With reference to the second aspect, in some implementations of the second aspect, the $t_2^{th}$ second subsequence is detected. When at least one column vector in one column vector group meets a preset condition, it is determined that the one column vector group is the one column vector group in the codebook $E_{t2}$ corresponding to the $t_2^{th}$ first subsequence.

In this technical solution, when the at least one column vector in the column vector group meets the preset condition, it may be determined that the vector group exists, so that technical effect of improving decoding reliability can be achieved.

With reference to the second aspect, in some implementations of the second aspect, the $t_2^{th}$ second subsequence is detected. When any column vector in one column vector group meets a preset condition, it is determined that the one column vector group is the one column vector group in the codebook $E_{t2}$ corresponding to the $t_2^{th}$ first subsequence.

In this technical solution, when the column vector in the column vector group meets the preset condition, it may be determined that the column vector exists, so that technical effect of adding more users for simultaneous transmission can be improved.

With reference to the second aspect, in some implementations of the second aspect, the T second subsequences are detected. When at least one column vector in $T_1$ column vector groups meets a preset condition and any column vector in $T_2$ column vector groups meets a preset condition, it is determined that the column vector group is a column vector group in a codebook corresponding to the T first subsequences, where $T=T1+T2$.

In this technical solution, a combination of the two different manners can not only achieve technical effect of enhancing protection for an important first subsequence, avoiding a case in which a subsequent block cannot be detected due to missed detection, and improving decoding reliability, but also achieve technical effect of increasing a transmission rate and adding more users for simultaneous transmission. The combination of the two manners provides maximum function flexibility for overall optimization of system performance.

With reference to the second aspect, in some implementations of the second aspect, any two column vectors in two column vector groups corresponding to any two first subsequences do not overlap with each other.

In this technical solution, one first subsequence is mapped to the at least two column vectors corresponding to the codebook, and the any two column vectors in the column vector group corresponding to the any two first subsequences do not overlap with each other. This can achieve technical effect of increasing redundancy, performing additional protection on the first subsequence, increasing the encoding gain, and improving decoding reliability.

With reference to the second aspect, in some implementations of the second aspect, at least two column vectors in two column vector groups corresponding to any two first subsequences do not overlap with each other.

In this technical solution, one first subsequence is mapped to the at least two column vectors corresponding to the codebook, and the at least two column vectors in the column vector group corresponding to the any two first subsequences do not overlap with each other, so that codeword space can be expanded, an information rate carried by each first subsequence can be increased, and a quantity of users that can be accommodated can be increased.

With reference to the second aspect, in some implementations of the second aspect, in the T first subsequences, any two column vectors in the column vector group corresponding to $T_1$ first subsequences do not overlap with each other.

At least two column vectors in the column vector group corresponding to $T_2$ first subsequences do not overlap with each other. Any one of the $T_1$ first subsequences and any one of the $T_2$ first subsequences are different sequences, and T=T1+T2.

In this technical solution, a combination of the two different manners can not only achieve technical effect of enhancing protection for an important first subsequence and improving reliability, but also achieve technical effect of increasing a transmission rate and increasing a quantity of users that can be accommodated. The combination of the two manners provides function flexibility for overall optimization of system performance.

With reference to the second aspect, in some implementations of the second aspect, one column vector group in the codebook corresponding to each of the T first subsequences is one of c column vector groups. c is a value obtained by rounding up or rounding down M/g. g is a quantity of column vectors in the one column vector group. M is a quantity of columns in the codebook. g is an integer greater than or equal to 1 and less than or equal to M.

With reference to the second aspect, in some implementations of the second aspect, one column vector group in the codebook corresponding to each of the T first subsequences is one of c column vector groups. $c=2^k$. k is a value obtained by rounding up or rounding down $\log_2 p$. p is equal to $C_M^b$. b is a quantity of column vectors in the one column vector group. M is a quantity of columns in the codebook. b is an integer greater than or equal to 1 and less than or equal to M.

With reference to the second aspect, in some implementations of the second aspect, outer-code decoding is performed on the T first subsequences to generate an original information sequence.

According to a third aspect, a communication apparatus is provided. The communication apparatus may include modules or units in a one-to-one correspondence for performing the method/operation/step/action described in the first aspect. The modules or units may be hardware circuits, software, or may be implemented by hardware circuits in combination with software. In a possible implementation, the apparatus includes:

a communication unit, configured to obtain a first sequence, where the first sequence includes T first subsequences, and T is a positive integer; a processing unit, configured to determine T encoding vectors based on the T first subsequences, where a quantity of non-zero elements in at least one of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1 \in [1, T]$, and both $t_1$ and T are positive integers; the processing unit is further configured to generate T second subsequences based on one or more codebooks and the T encoding vectors, where each first subsequence corresponds to one column vector group in the one or more codebooks, and a column vector group corresponding to at least one of the T first subsequences includes at least two column vectors; and the communication unit is further configured to send the T second subsequences.

For beneficial effect brought by the foregoing communication apparatus, refer to specific descriptions of the first aspect. For brevity, details are not described herein again.

With reference to the third aspect, in some implementations of the third aspect, the processing unit is specifically configured to obtain a $t_2^{th}$ second subsequence by multiplying a codebook $E_{t2}$ by a $t_2^{th}$ encoding vector. The codebook $E_{t2}$ is a matrix with n rows and M columns. The $t_2^{th}$ encoding vector is determined based on a $t_2^{th}$ first subsequence. A length of the $t_2^{th}$ encoding vector is equal to M. $t2 \in [1,T]$. t2, n, and M are all positive integers. The codebook $E_{t2}$ is one of the one or more codebooks.

With reference to the third aspect, in some implementations of the third aspect, any two column vectors in two column vector groups corresponding to any two first subsequences do not overlap with each other.

With reference to the third aspect, in some implementations of the third aspect, at least two column vectors in two column vector groups corresponding to any two first subsequences do not overlap with each other.

With reference to the third aspect, in some implementations of the third aspect, in the T first sequences, any two column vectors in the column vector group corresponding to $T_1$ first subsequences do not overlap with each other. At least two column vectors in the column vector group corresponding to $T_2$ first subsequences do not overlap with each other. Any one of the $T_1$ first subsequences and any one of the $T_2$ first subsequences are different sequences, and T=T1+T2.

With reference to the third aspect, in some implementations of the third aspect, one column vector group in the codebook corresponding to each of the T first subsequences is one of c column vector groups. c is a value obtained by rounding up or rounding down M/g. g is a quantity of column vectors in the one column vector group. M is a quantity of columns in the codebook. g is an integer greater than or equal to 1 and less than or equal to M.

With reference to the third aspect, in some implementations of the third aspect, one column vector group in the codebook corresponding to each of the T first subsequences is one of c column vector groups. $c=2^k$. k is a value obtained by rounding up or rounding down $\log_2 p$. p is equal to $C_M^b$. b is a quantity of column vectors in the one column vector group. M is a quantity of columns in the codebook. b is an integer greater than or equal to 1 and less than or equal to M.

With reference to the third aspect, in some implementations of the third aspect, before obtaining the first sequence, the processing unit is further configured to perform outer-code encoding on an original information sequence to generate the first sequence.

According to a fourth aspect, a communication apparatus is provided. The communication apparatus may include modules or units in a one-to-one correspondence for performing the method/operation/step/action described in the second aspect. The modules or units may be hardware circuits, software, or may be implemented by hardware circuits in combination with software. In a possible implementation, the apparatus includes:

a communication unit, configured to obtain T second subsequences, where the T second subsequences are generated based on one or more codebooks and T encoding vectors, the T encoding vectors are generated based on T first subsequences, a quantity of non-zero elements in at least one of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1 \in [1, T]$, and both $t_1$ and T are positive integers; and a processing unit, configured to perform inner-code decoding on the T second subsequences based on the one or more codebooks, to obtain the T first subsequences, where each first subsequence corresponds to one column vector group in the one or more codebooks, and a column vector group corresponding to at least one of the T first subsequences includes at least two column vectors.

For beneficial effect brought by the foregoing communication apparatus, refer to specific descriptions of the second aspect. For brevity, details are not described herein again.

With reference to the fourth aspect, in some implementations of the fourth aspect, the processing unit is specifically configured to: determined, by detecting a $t_2^{th}$ second subsequence, one column vector group in a codebook $E_{t2}$ corresponding to a $t_2^{th}$ first subsequence is, where t2∈[1, T], t2 is a positive integer, and the codebook $E_{t2}$ is one of the one or more codebooks; and determine the $t_2^{th}$ first subsequence based on the one column vector group in the codebook $E_{t2}$ corresponding to the $t_2^{th}$ first subsequence.

With reference to the fourth aspect, in some implementations of the fourth aspect, the processing unit is further specifically configured to detect the $t_2^{th}$ second subsequence, and when at least one column vector in one column vector group meets a preset condition, determine that the one column vector group is the one column vector group in the codebook $E_{t2}$ corresponding to the $t_2^{th}$ first subsequence.

With reference to the fourth aspect, in some implementations of the fourth aspect, the processing unit is further specifically configured to detect the $t_2^{th}$ second subsequence, and when any column vector in one column vector group meets a preset condition, determine that the one column vector group is the one column vector group in the codebook $E_{t2}$ corresponding to the $t_2^{th}$ first subsequence.

With reference to the fourth aspect, in some implementations of the fourth aspect, the processing unit is further specifically configured to: detect the T second subsequences, and when at least one column vector in $T_1$ column vector groups meets a preset condition and any column vector in $T_2$ column vector groups meets a preset condition, determine that the column vector group is a column vector group in a codebook corresponding to the T first subsequences, where T=T1+T2.

With reference to the fourth aspect, in some implementations of the fourth aspect, any two column vectors in two column vector groups corresponding to any two first subsequences do not overlap with each other.

With reference to the fourth aspect, in some implementations of the fourth aspect, at least two column vectors in two column vector groups corresponding to any two first subsequences do not overlap with each other.

With reference to the fourth aspect, in some implementations of the fourth aspect, in the T first subsequences, any two column vectors in the column vector group corresponding to $T_1$ first subsequences do not overlap with each other. At least two column vectors in the column vector group corresponding to $T_2$ first subsequences do not overlap with each other. Any one of the $T_1$ first subsequences and any one of the $T_2$ first subsequences are different sequences, and T=T1+T2.

With reference to the fourth aspect, in some implementations of the fourth aspect, one column vector group in the codebook corresponding to each of the T first subsequences is one of c column vector groups. c is a value obtained by rounding up or rounding down M/g. g is a quantity of column vectors in the one column vector group. M is a quantity of columns in the codebook. g is an integer greater than or equal to 1 and less than or equal to M.

With reference to the fourth aspect, in some implementations of the fourth aspect, one column vector group in the codebook corresponding to each of the T first subsequences is one of c column vector groups. $c=2^k$. k is a value obtained by rounding up or rounding down $\log_2 p$. p is equal to $C_M^b$. b is a quantity of column vectors in the one column vector group. M is a quantity of columns in the codebook. b is an integer greater than or equal to 1 and less than or equal to M.

With reference to the fourth aspect, in some implementations of the fourth aspect, the processing unit is further specifically configured to perform outer-code decoding on the first sequence to obtain an original information sequence.

According to a fifth aspect, a communication apparatus is provided. The communication apparatus has a function of implementing the method in any one of the first aspect and the possible implementations of the first aspect. The function may be implemented by hardware, or may be implemented by hardware executing corresponding software. The hardware or the software includes one or more units corresponding to the functions.

In a possible design, when some or all of the function is implemented by the hardware, the communication apparatus includes: an input interface circuit, configured to obtain a first sequence; and a logic circuit, configured to generate T second subsequences based on one or more codebooks and T encoding vectors.

During specific implementation, the communication apparatus may be a chip or an integrated circuit.

In a possible design, when some or all of the function is implemented by the software, the communication apparatus includes: a memory, configured to store a computer program; and a processor, configured to execute the computer program stored in the memory. When the computer program is executed, the communication apparatus may implement the data transmission method according to any one of the first aspect or the possible designs of the first aspect.

Optionally, the memory may be a physically independent unit, or may be integrated with the processor.

In a possible design, when some or all of the function is implemented by using the software, the communication apparatus includes only the processor. The memory configured to store the program is located outside the communication apparatus. The processor is connected to the memory through a circuit/wire, and is configured to read and run the program stored in the memory, to perform the data transmission method in any one of the first aspect or the possible implementations of the first aspect.

According to a sixth aspect, a communication apparatus is provided. The communication apparatus has a function of implementing the method in any one of the second aspect and the possible implementations of the second aspect. The function may be implemented by hardware, or may be implemented by hardware executing corresponding software. The hardware or the software includes one or more units corresponding to the functions.

In a possible design, when some or all of the function is implemented by the hardware, the communication apparatus includes: an input interface circuit, configured to obtain T second subsequences; a logic circuit, configured to perform the decoding method in the second aspect; and an output interface circuit, configured to output an original information sequence.

Optionally, the communication apparatus may be a chip or an integrated circuit.

In a possible design, when some or all of the function is implemented by the software, the communication apparatus includes: a memory, configured to store a computer program; and a processor, configured to execute the computer program stored in the memory. When the computer program is executed, the communication apparatus may implement the decoding method according to the second aspect.

Optionally, the memory may be a physically independent unit, or may be integrated with the processor.

In a possible design, when some or all of the function is implemented by using the software, the communication apparatus includes only the processor. The memory configured to store the program is located outside the communication apparatus. The processor is connected to the memory through a circuit/wire, and is configured to read and run the program stored in the memory, to perform the decoding method in the second aspect.

During specific implementation, the communication apparatus may be the chip or the integrated circuit.

According to a seventh aspect, this application provides a network device, including a transceiver, a processor, and a memory. The processor is configured to control the transceiver to receive and send a signal, the memory is configured to store a computer program, and the processor is configured to invoke and run the computer program stored in the memory, so that the method in any possible implementation of the first aspect is performed.

According to an eighth aspect, this application provides a terminal device, including a transceiver, a processor, and a memory. The processor is configured to control the transceiver to receive and send a signal, the memory is configured to store a computer program, and the processor is configured to invoke and run the computer program stored in the memory, so that the method in any possible implementation of the second aspect is performed.

According to a ninth aspect, this application provides a computer-readable storage medium. The computer-readable storage medium stores instructions, and when the instructions are run on a computer, the method in any one of the first aspect or the possible implementations of the first aspect is performed.

According to a tenth aspect, this application provides a computer program product. The computer program product includes computer program code, and when the computer program code is run on a computer, the method in any one of the first aspect and the possible implementations of the first aspect is performed.

According to an eleventh aspect, this application provides a chip, including a processor. The processor is configured to read and execute a computer program stored in a memory, to perform the method according to the first aspect or any possible implementation of the first aspect. Optionally, the chip includes the memory, and the memory and the processor are connected to the memory through a circuit or a wire. Further optionally, the chip further includes a communication interface, and the processor is connected to the communication interface. The communication interface is configured to receive T first subsequences. The processor obtains the T first subsequences from the communication interface, determines T encoding vectors, and generates T second subsequences based on one or more codebooks and the T encoding vectors. The communication interface outputs T encoded second subsequences. The communication interface may be an input/output interface.

According to a twelfth aspect, this application provides a computer-readable storage medium. The computer-readable storage medium stores instructions, and when the instructions are run on a computer, the method in any one of the second aspect or the possible implementations of the second aspect is performed.

According to a thirteenth aspect, this application provides a computer program product. The computer program product includes computer program code, and when the computer program code is run on a computer, the method in any one of the second aspect or the possible implementations of the second aspect is performed.

According to a fourteenth aspect, this application provides a chip, including a processor. The processor is configured to read and execute a computer program stored in a memory, to perform the method according to any one of the second aspect or any possible implementation of the second aspect.

Optionally, the chip includes the memory, and the memory and the processor are connected to the memory through a circuit or a wire. Further optionally, the chip further includes a communication interface, and the processor is connected to the communication interface. The communication interface is configured to receive T second subsequences. The processor obtains the T second subsequences from the communication interface, and decodes the T second subsequences by using the decoding method described in the second aspect, to obtain an original information sequence. The communication interface outputs the original information sequence. The communication interface may be an input/output interface.

According to a fifteenth aspect, this application provides a communication system, including the network device in the fifth aspect and the terminal device in the sixth aspect.

DETAILED DESCRIPTION OF ILLUSTRATIVE EMBODIMENTS

The following describes technical solutions of this application with reference to accompanying drawings.

Figure 1:
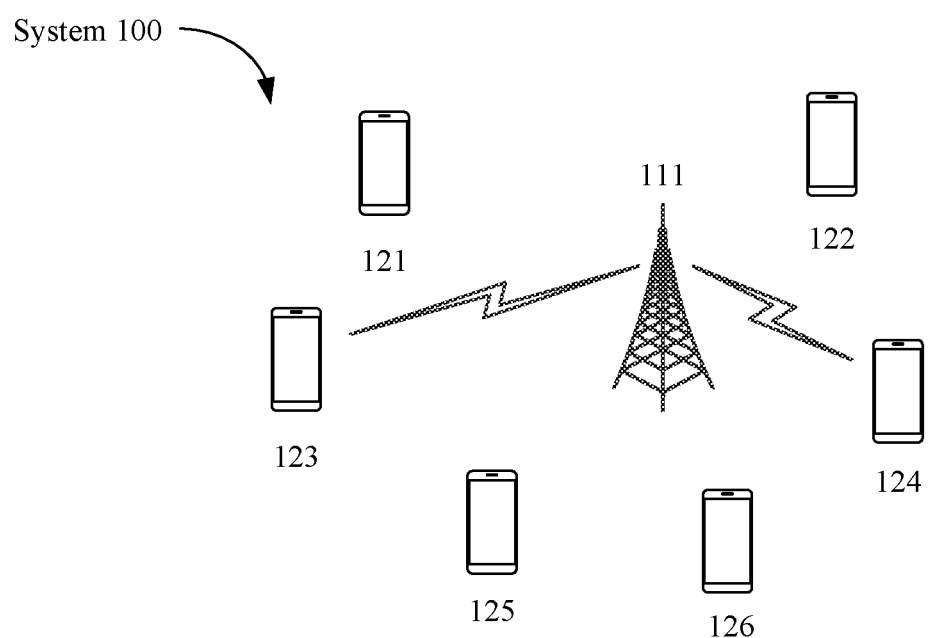
FIG. 1 is an architectural diagram of a wireless communication system 100.

FIG. 1 is an architectural diagram of a wireless communication system 100. As shown in FIG. 1, the wireless communication system 100 may include at least one network device and one or more terminal devices. The network device (denoted as 111 in FIG. 1) may communicate with the one or more terminal devices (denoted as 122 to 126 in FIG. 1) in a wireless manner. There are a large quantity of terminal devices in a system, but a quantity of terminal devices that simultaneously activate data transmission to the network device is relatively small.

The wireless communication system in this application includes but is not limited to three application scenarios of a long term evolution (LTE) system, an LTE frequency division duplex (FDD) system, an LTE time division duplex (TDD) system, and a fifth generation mobile communication technology (5G), that is, enhanced mobile broadband (eMBB), ultra reliable low latency communication (URLLC), enhanced massive machine type communication (eMTC), or a future communication system.

The terminal device in the embodiments of this application may be referred to as user equipment (UE), a terminal, an access terminal, a subscriber unit, a subscriber station, a mobile station, a mobile console, a remote station, a remote terminal, a mobile device, a user terminal, a terminal, a wireless communication device, a user agent, or a user apparatus. Alternatively, the terminal device may be a cellular phone, a cordless phone, a session initiation protocol (SIP) phone, a wireless local loop (WLL) station, a personal digital assistant (PDA), a handheld device with a wireless communication function, a computing device or another processing device connected to a wireless modem, an in-vehicle device, a wearable device, a terminal device in a 5G network, a terminal device in a future evolved public land mobile communication network (PLMN), a virtual reality (VR) terminal device, an augmented reality (AR) terminal device, a wireless device in industrial control, a wireless device in self driving, a wireless device in remote medical, a wireless device in a smart grid, a wireless device in transportation safety, a wireless device in a smart city, a wireless device in a smart home, and the like. This is not limited in this application.

The network device in this application may be a device configured to communicate with the terminal device. The network device may be a base station, or may be a device obtained after integrating a base station and a base station controller, or may be another device having a similar communication function. The base station herein may be an evolved NodeB (eNB or eNodeB) in the long term evolution (LTE) system, or may be a radio controller in a cloud radio access network (CRAN) scenario. Optionally, the network device in embodiments of this application may include base stations in various forms, for example, a macro base station, a micro base station (also referred to as a small cell), a relay station, an access point, a 5G base station or a future base station, a transmitting and receiving point (TRP), a transmission point (TP), a mobile switching center, a device that provides a base station function in device-to-device (D2D), vehicle-to-everything (V2X), and machine-to-machine (M2M) communication, and the like. This is not specifically limited in embodiments of this application.

A wireless technology is used for communication between the network device and the terminal devices in FIG. 1. When the network device sends a signal, the network device is a transmit end. When the network device receives a signal, the network device is a receive end. Similarly, when the terminal device sends a signal, the terminal device is a transmit end. When the terminal device receives a signal, the terminal device is a receive end.

Figure 2:
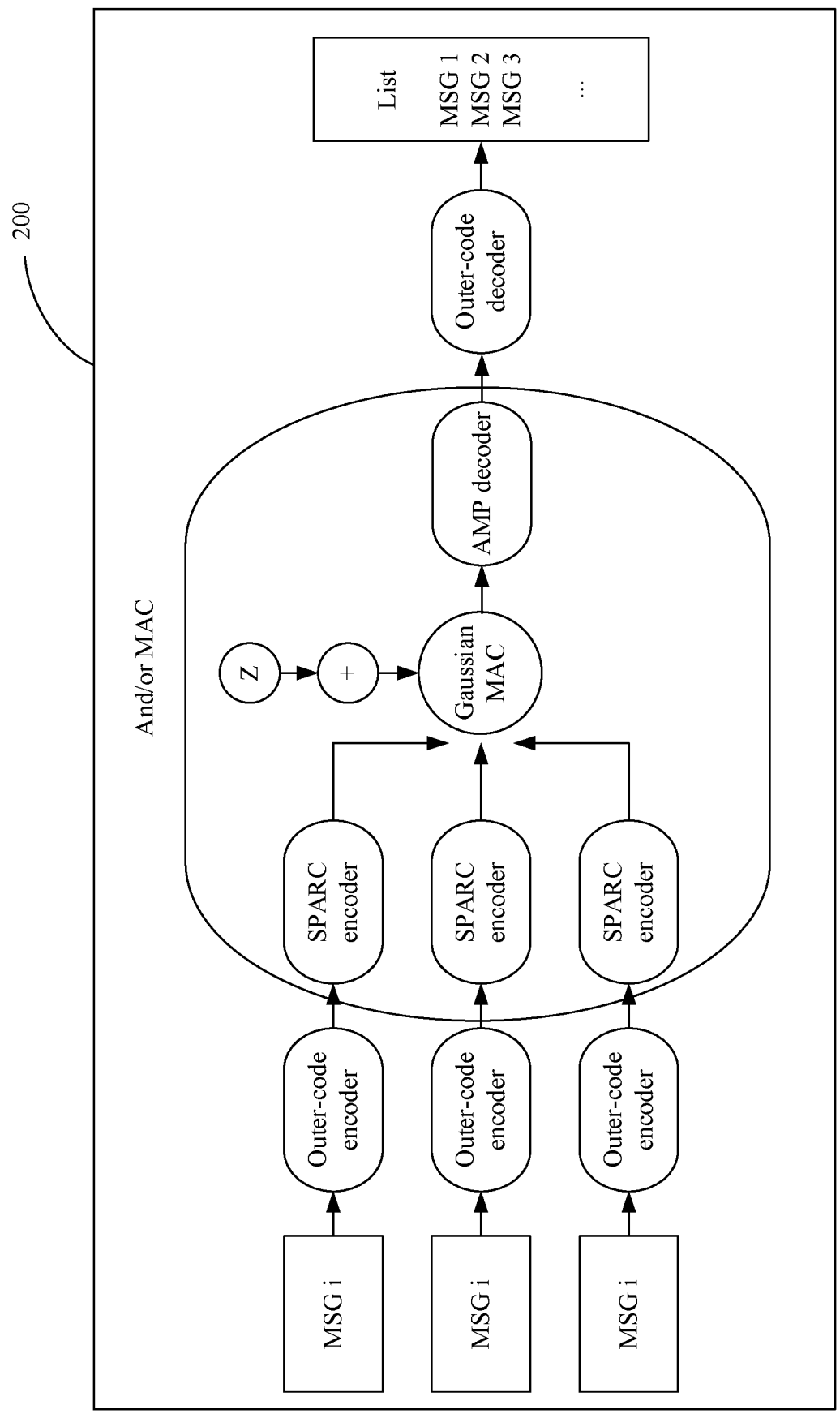
FIG. 2 is a schematic diagram of an overall structure of a passive random access system.

FIG. 2 is a schematic diagram of an overall structure of a passive random access system. As shown in FIG. 2, a plurality of terminal devices access a network. For a terminal device i, it is assumed that information (an original information sequence) that needs to be sent by the terminal device i at a moment is an MSG i. Outer-code encoding is first performed on the terminal device i, and tree encoding may be used for outer-code encoding.

Figure 3:
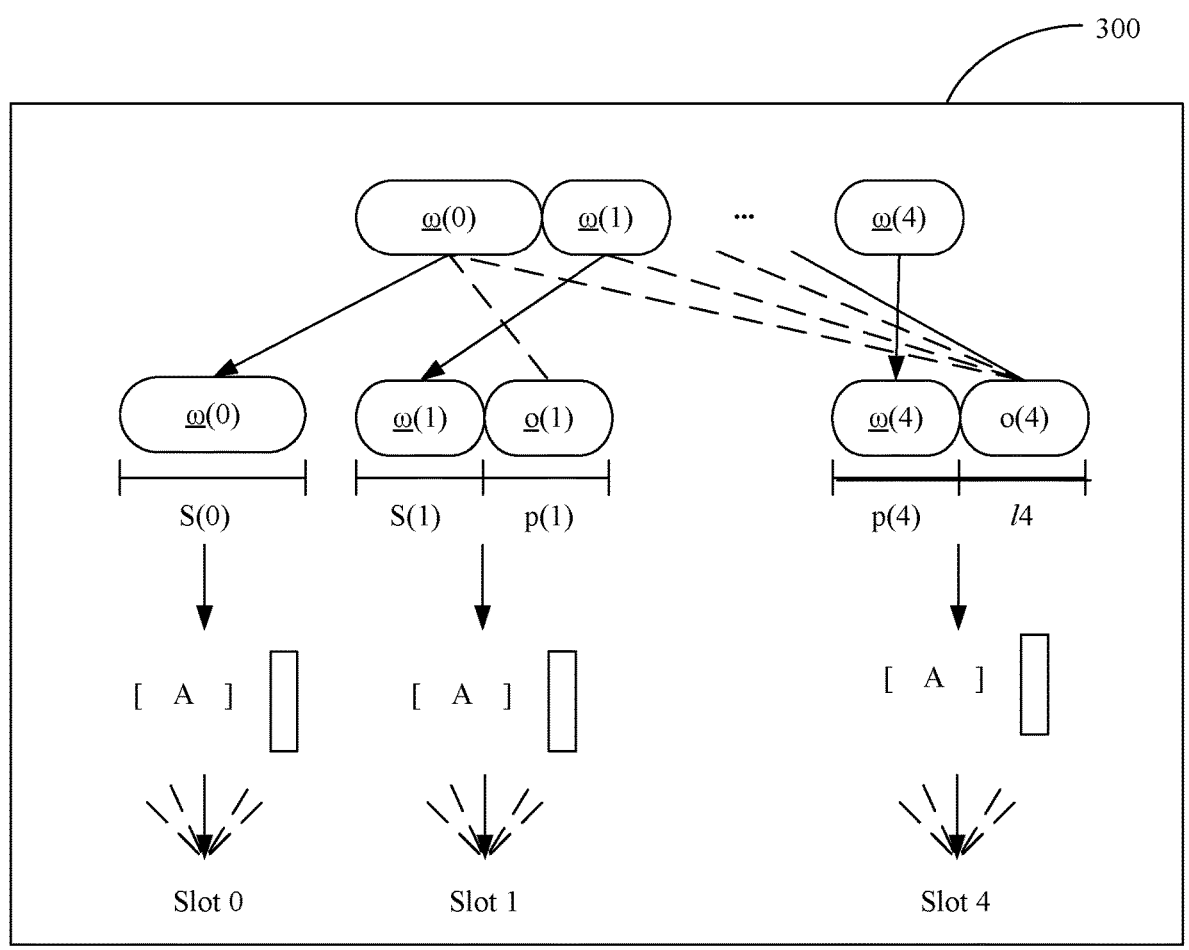
FIG. 3 is a schematic diagram of outer-code encoding based on tree encoding.

FIG. 3 is a schematic diagram of outer-code encoding based on tree encoding. As shown in FIG. 3, an original information sequence is first divided into T original information subsequences. A quantity of bits included in each original information subsequence may be different. It is assumed that an index of the original information subsequence starts from 0, that is, a number of a first original information subsequence is 0, and numbers of subsequent subsequences increase in sequence. An original information sequence included in an $(n+1)^{th}$ original information subsequence is denoted as $\omega_{(n)}$, and a quantity of bits is denoted as $m_n$. An outer-code bit sequence is added to each original information subsequence, for example, the outer-code bit sequence is added to the $(n+1)^{th}$ original information subsequence. The outer-code bit sequence is generated by encoding based on $\omega_{(0)}, \omega_{(1)}, \ldots, \omega_{(n-1)}$, and $\omega_{(n)}$, and a length is $l_n$. To some extent, the outer-code bit sequence may be equivalent to a check bit sequence of original information bit sequences of all previous n+1 original information subsequences including the $(n+1)^{th}$ original information subsequence. According to research, to obtain good performance, an original information bit included in a previous original information subsequence needs to be long, the length of the outer-code bit sequence needs to be short, and a subsequent original information subsequence needs to be opposite. Generally, after the outer-code bit sequence is added to each original information subsequence, lengths of included original information bits plus lengths of the outer-code bit sequences are the same, and a first original information subsequence does not include the outer-code bit sequence.

Figure 4:
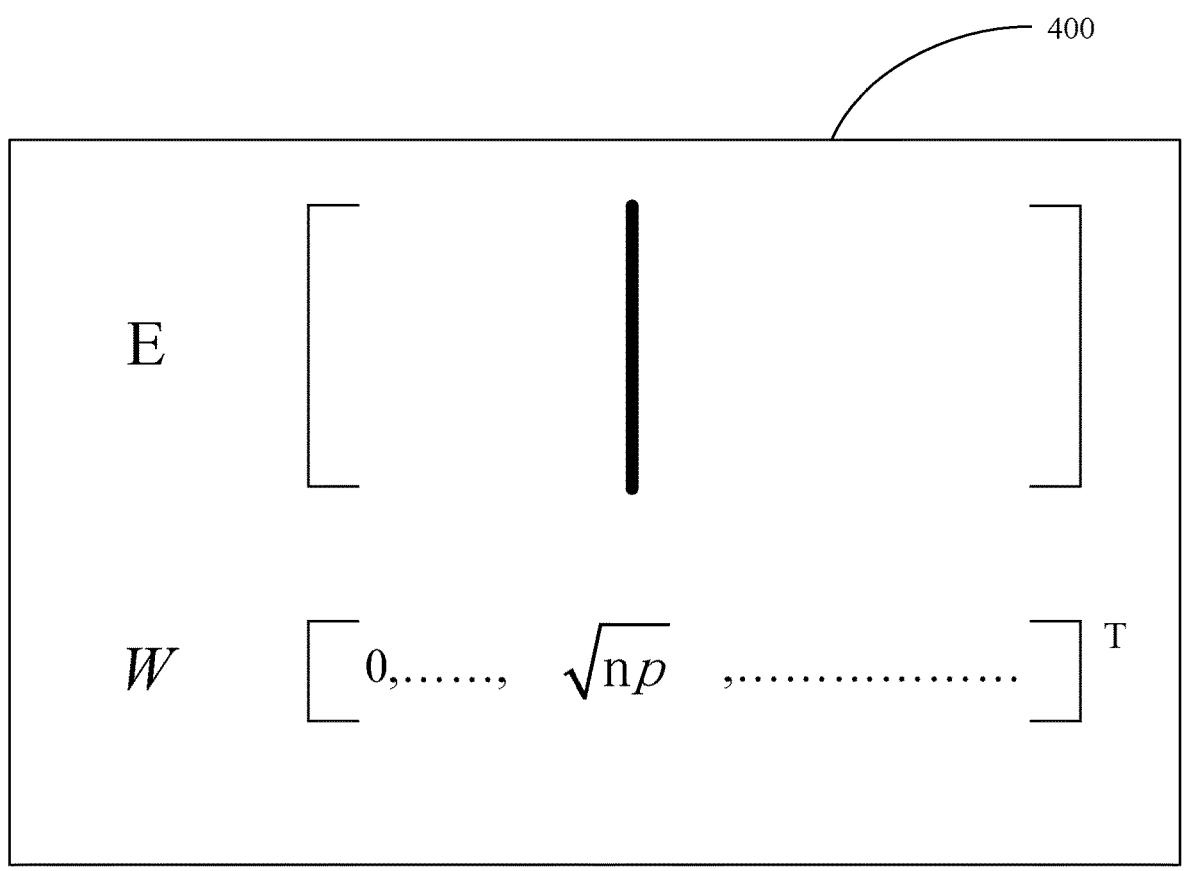
FIG. 4 is a schematic diagram of inner-code encoding based on passive multi-user sparse regression code.

Inner-code encoding is performed on a sequence obtained after tree encoding, that is, sparse regression code (SPARC) encoding is performed on the sequence, and then an obtained signal is directly sent. FIG. 4 is a schematic diagram of inner-code encoding based on passive multi-user sparse regression code. As shown in FIG. 4, T first sequences obtained after outer-code encoding are obtained. After inner-code encoding is performed on each of the T first sequences, E*W is sent. E is a codebook, is an n*M independent co-distributed matrix, and includes M column vectors whose lengths are code lengths n. W is an M*1 matrix whose lengths are M, and W has one non-zero element. In other words, W indicates a bit sequence obtained by performing outer-code encoding, only one row is not 0, and other rows are all 0. A location of a row in which 1 is located indicates the first sequence obtained through outer-code encoding, and may be considered as location modulation. It can be learned that, $\log_2 M = s+p$, where s is a length of the information bit sequence in the first sequence, p is a length of a check bit sequence in the first sequence, s is a positive integer, and p is an integer greater than or equal to 0. Finally, after outer-code modulation and inner-code modulation are performed, a transmit signal may be considered as the T first sequences. Each first sequence occupies n transmission resources, and bit signals transmitted on the n resources exactly correspond to a column vector in the matrix E.

After channel superposition is performed on a signal of a terminal i and a signal of another terminal device that is sent at a same moment, a receive end restores, by using an approximation message passing (AMP) decoder, a bit sequence of a sparse regression code before inner-code encoding, and then separates a signal of each user by using an outer-code decoder. The outer-code decoder may perform tree decoding.

Figure 5:
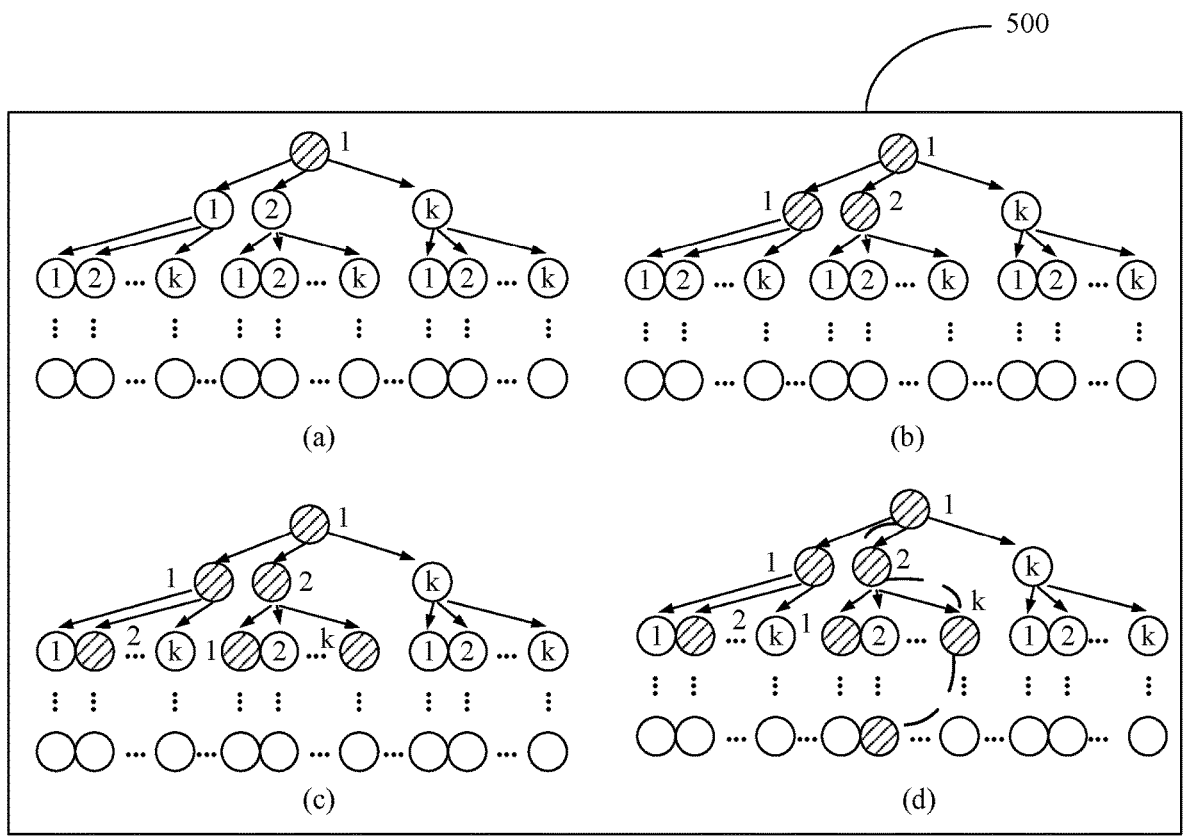
FIG. 5 is a schematic diagram of an operation of outer-code decoding based on tree code.

FIG. 5 is a schematic diagram of an operation of outer-code decoding based on tree code. As shown in FIG. 5, FIG. 5(a) is a phase 0, and node 1 is a root node of a tree structure. FIG. 5(b) is a phase 1, and parity constraints of all subnodes of the root node are verified, where subnodes 1 and 2 in a second row that are shadowed meet the parity constraints. FIG. 5(c) is a phase 2, and parity constraints of all subnodes of the subnodes 1 and 2 in the second row are verified, a shadowed subnode in a third row is a subnode that meets the parity constraints. FIG. 5(d) shows a phase n−1, and only a parity constraint of a subnode reserved in a phase n−2 is verified. A shadowed subnode is a subnode that meets a parity constraint in the phase n−1, where a path indicated by a dashed line is a valid path decoded by the tree decoder.

Complete reception of a piece of user information is implemented through outer code and tree decoding search. A sequence of tree search determines that a node close to the root is more important. In addition, to obtain good performance, an outer-code sequence in the front is short. For example, a first sequence usually does not include a check bit. Therefore, if a sequence in the front is not detected or is incorrectly detected, an entire sequence may not be recovered. In addition, for a scenario in which an activation rate is excessively low, location modulation is used, and a quantity of sequences is small. In addition, in this solution, a maximum quantity of concurrent activations is limited, and this solution is not applicable to a scenario with a high activation rate.

Figure 6:
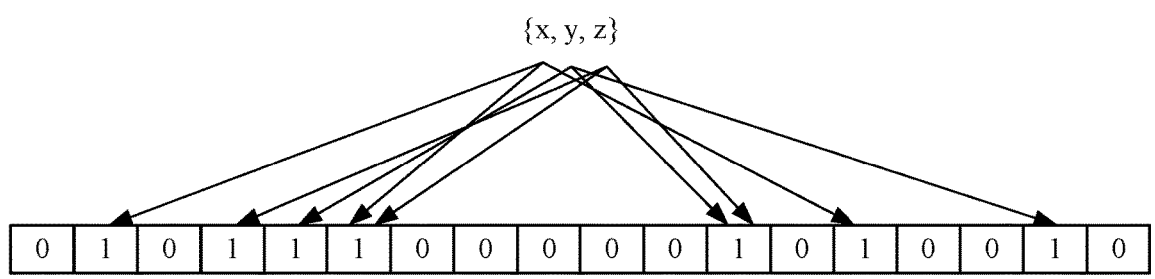
FIG. 6 is a schematic diagram of a mapping relationship according to an embodiment of this application.

To resolve the foregoing disadvantages, an embodiment of this application provides a data transmission method. FIG. 6 is a schematic diagram of a mapping relationship according to an embodiment of this application. As shown in FIG. 6, in an element set {x, y, z}, x, y, and z are respectively mapped to specific locations, and different elements may be mapped to a same location. A main idea is that the same location can be mapped by a plurality of elements, and each element is mapped to a plurality of locations. When checking whether an element exists, all locations to which the element needs to be mapped are checked. If all locations to which the element is mapped have records, it is determined that the element may exist. Otherwise, it is determined that the element does not exist. However, because the plurality of elements may be mapped to a same location, the element may actually not exist, but each location to which the element is mapped is recorded. In the technical solutions of this application, the foregoing problem can be effectively resolved by using a structural feature of the outer code.

The following describes in detail embodiments provided in this application with reference to the accompanying drawings.

It should be understood that, in embodiments of this application, to avoid loss of generality, a first sequence indicates a sequence obtained by performing outer-code encoding on an original information sequence, and a second sequence indicates a sequence obtained by performing inner-code encoding on the first sequence.

Figure 7:
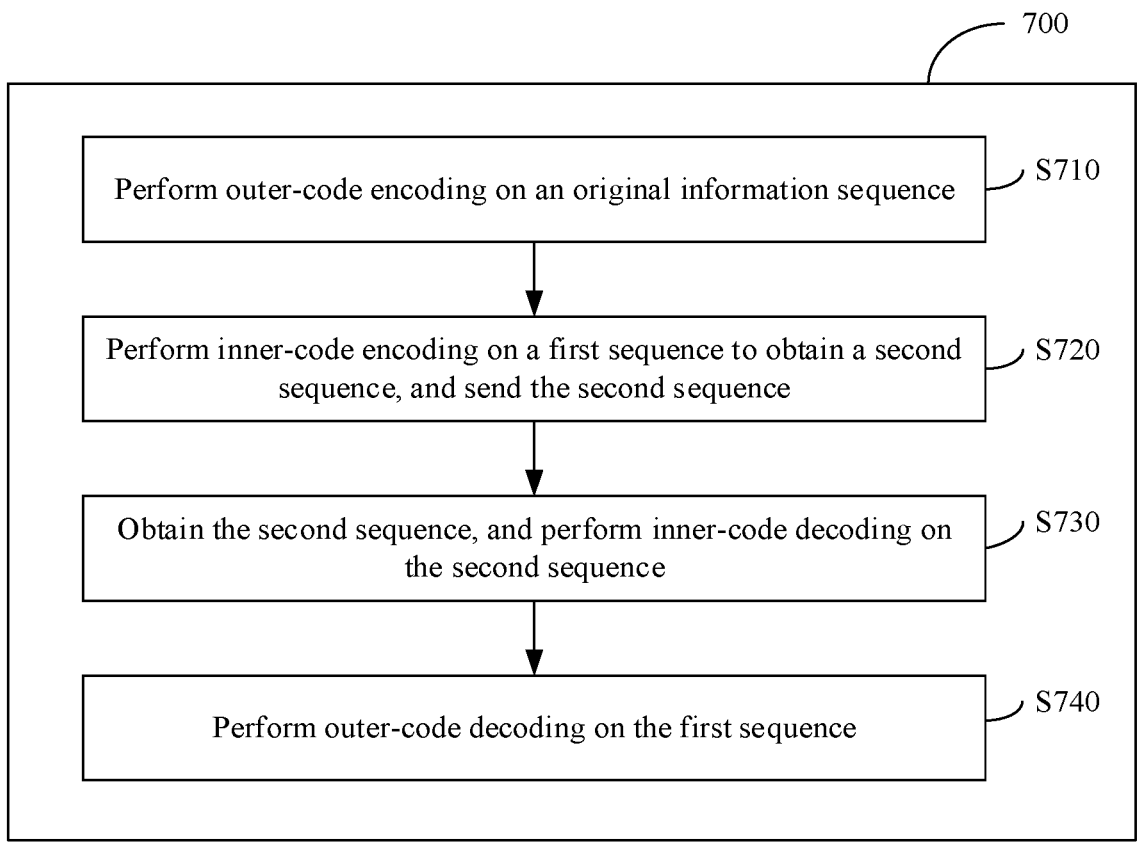
FIG. 7 is a schematic flowchart of a data transmission method 700 according to an embodiment of this application.

FIG. 7 is a schematic flowchart of a data transmission method 700 according to an embodiment of this application. The method 700 may be performed by a transmit end.

S710: Perform outer-code encoding on an original information sequence.

For example, after obtaining the original information sequence, an outer-code encoder performs tree encoding on the original information sequence to obtain a first sequence. The first sequence includes T first subsequences, and T is a positive integer.

S720: Perform inner-code encoding on the first sequence to obtain a second sequence, and send the second sequence.

Specifically, the T first subsequences are encoded to obtain T second subsequences, and the T second subsequences are sent. The T second subsequences form the second sequence.

For example, after obtaining the first sequence output by the outer-code encoder, an inner-code encoder performs, by using the method provided in this embodiment of this application, inner-code encoding based on passive multi-user sparse regression code on the first sequence, to obtain the second sequence.

S730: Obtain the second sequence, and perform inner-code decoding on the second sequence.

For example, after the second sequence is obtained, inner-code decoding is performed on the second sequence to obtain the first sequence. Optionally, the second sequence may be decoded by using an approximate message passing (AMP) decoder, to obtain the first sequence.

S740: Perform outer-code decoding on the first sequence.

For example, the outer-code decoder obtains the first sequence, and performs outer-code decoding on the first sequence to obtain the original information sequence. Optionally, outer-code decoding is performed by using a tree-code-based outer-code decoder.

The outer-code decoder may restore an original information sequence of any terminal device. It can be learned from the foregoing description that, for a plurality of second subsequences, the AMP decoder may decode a plurality of sequences from a plurality of users. For the plurality of second subsequences, it is critical to determine that second subsequences come from a same terminal device. This function is implemented by the outer-code decoder. During outer-code encoding, an outer-code sequence added to each first sequence is related to information about all previous first subsequences, and may be considered as a check sequence. Therefore, in this manner, it can be determined that each first subsequence and a previous first subsequence belong to a same original information sequence, to obtain independent original information sequences of a plurality of terminal devices.

Figure 8:
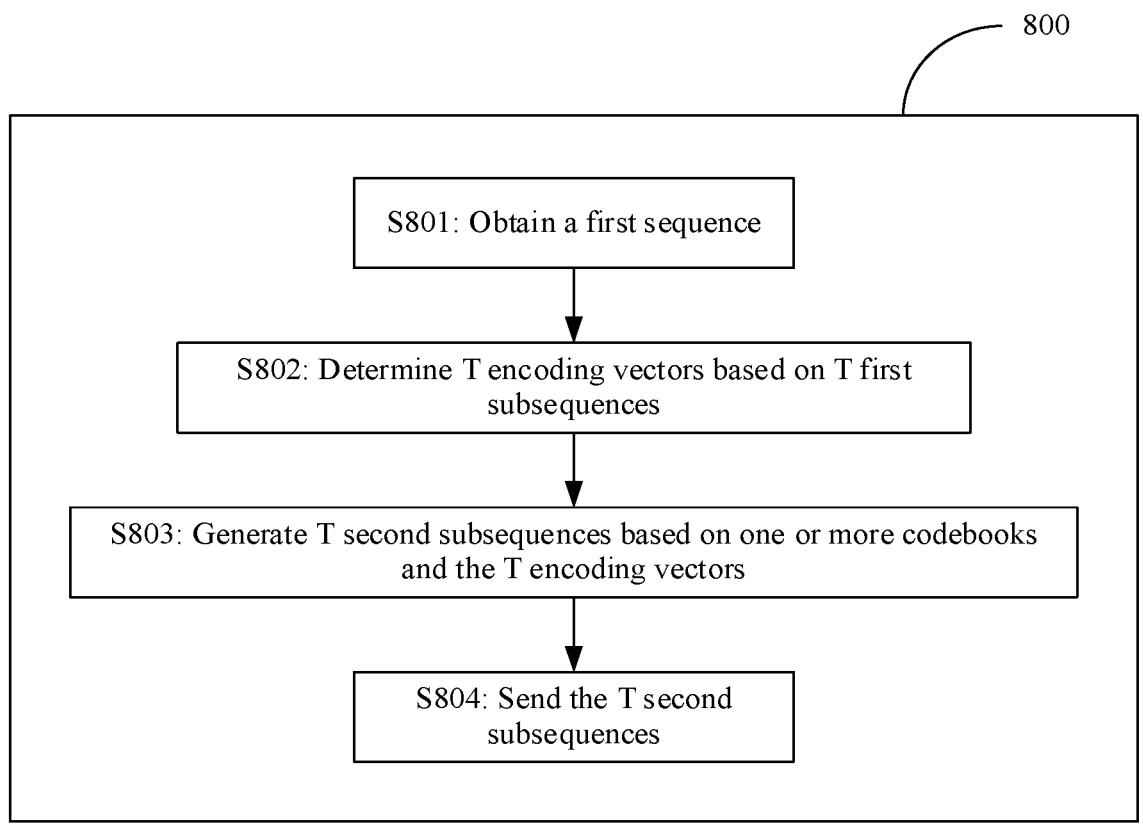
FIG. 8 is a schematic flowchart of a data transmission method 800 according to an embodiment of this application.

The following describes S720 in detail. FIG. 8 is a schematic flowchart of a data transmission method 800 according to an embodiment of this application. As shown in FIG. 8, a specific procedure is described as follows.

S801: Obtain a first sequence.

For example, an inner-code encoder obtains the first sequence encoded by an outer-code encoder, where the first sequence includes T first subsequences, and T is a positive integer.

S802: Determine T encoding vectors based on the T first subsequences.

For example, the inner-code encoder determines the T encoding vectors based on the T first subsequences. A quantity of non-zero elements in at least one of the T encoding vectors is greater than or equal to 2. The T first subsequences are in a one-to-one correspondence with the T encoding vectors. A location of a non-zero element in a $t_1^{th}$ encoding vector in the T encoding vectors is determined based on a $t_1^{th}$ to-be-encoded subsequence, $t_1 \in [1, T]$, and both $t_1$ and T are positive integers.

S803: Generate T second subsequences based on one or more codebooks and the T encoding vectors.

For example, the inner-code encoder generates the T second subsequences based on the one or more codebooks and the T encoding vectors.

S804: Send the T second subsequences.

For example, after generating the T second subsequences, the inner-code encoder sends the T second subsequences to an inner-code decoder.

Figure 9:
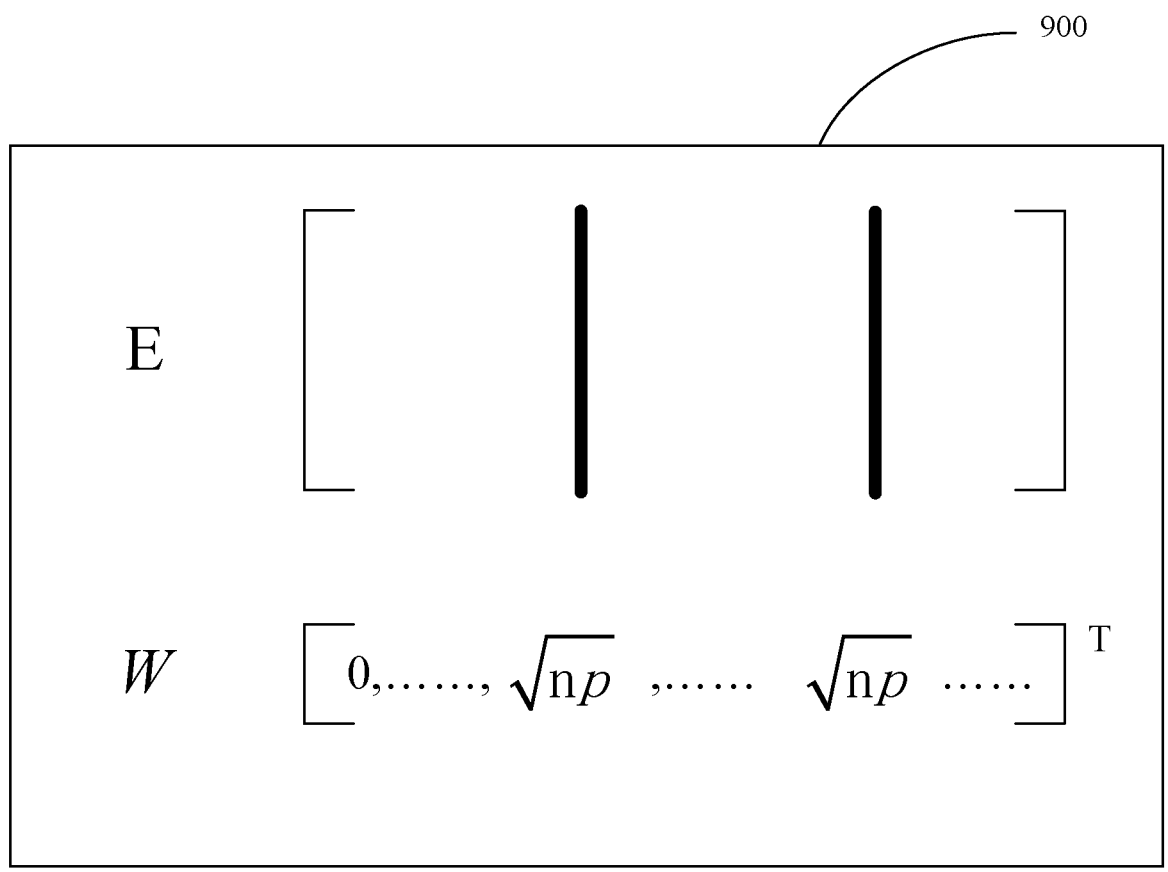
FIG. 9 is a schematic diagram of inner-code encoding based on passive multi-user sparse regression code according to an embodiment of this application.

For example, FIG. 9 is a schematic diagram of inner-code encoding based on passive multi-user sparse regression code according to an embodiment of this application. As shown in FIG. 9, after inner-code encoding is performed on each first subsequence obtained through outer-code encoding, an encoding vector W* a codebook E is sent. The codebook E is an independent co-distributed matrix with n rows and M columns. A length of the encoding vector W is equal to M, and there is $a_n\sqrt{np}$, that is, there are $a_n$ non-zero elements, and $a_n$ is greater than or equal to 2. In other words, W indicates a first sequence obtained through outer-code encoding, only a row $a_n$ is not 0, and other rows are all 0. A location of a row in which $a_n$ is located indicates the first sequence obtained through outer-code encoding, and may be considered as location modulation. Finally, after outer-code modulation and inner-code modulation are performed, a transmit signal may be considered as T second subsequences. Each second subsequence occupies n transmission resources, a bit signal transmitted on the n resources exactly corresponds to a column vector group in a matrix E. One column vector group includes at least two column vectors, and n, M, and T are all positive integers.

Optionally, one codebook may correspond to one encoding vector, or may correspond to a plurality of encoding vectors. This is not limited herein in this application.

First, T encoding vectors are determined based on T first subsequences. The T first subsequences are in a one-to-one correspondence with the T encoding vectors. A quantity of non-zero elements in at least one of the T encoding vectors is greater than or equal to 2. A location of a non-zero element in a $t_1^{th}$ encoding vector is determined based on a $t_1^{th}$ first subsequence. A length of each encoding vector is equal to M. The $t_1^{th}$ encoding vector corresponds to the $t_1^{th}$ first subsequence, $t_1 \in [1, T]$, and both $t_1$ and T are positive integers. For different first subsequences, in a specific implementation process, quantities of non-zero elements may be the same or may be different. This is not limited herein in this application.

Then, the T second subsequences are generated based on one or more codebooks and the T encoding vectors.

In a possible implementation, a $t_2^{th}$ second subsequence is obtained by multiplying a codebook $E_{t2}$ by a $t_2^{th}$ encoding vector. The $t_2^{th}$ encoding vector is determined based on a $t_2^{th}$ first subsequence. The codebook $E_{t2}$ is a matrix with n rows and M columns, $t_2 \in [1, T]$, and the codebook $E_{t2}$ is one of the one or more codebooks.

After obtaining the T first subsequences, an inner-code encoder encodes the T first subsequences, that is, generates the T second subsequences based on the one or more codebooks and the T encoding vectors.

There is a mapping relationship between the T first subsequences and the codebook, and descriptions are as follows.

In a possible implementation, the mapping relationship is that any two column vectors in a column vector group in the codebook corresponding to any two first subsequences do not overlap with each other. For specific descriptions of the mapping relationship, refer to the following descriptions in S1002.

In another possible implementation, the mapping relationship is that at least two column vectors in two column vector groups that meet the mapping relationship with any two first subsequences do not overlap with each other. For specific descriptions of the mapping relationship, refer to the following descriptions in S1002.

In another possible implementation, the mapping relationship is that any two column vectors in a column vector group in a codebook corresponding to each of first k first subsequences do not overlap with each other. Further, each first subsequence is mapped to a column vector group in c column vector groups, has a mapping relationship with only the first subsequence, and has no mapping relationship with another first subsequence. At least two column vectors in one column vector group corresponding to each of a $(k+1)^{th}$ to a $T^{th}$ first subsequences do not overlap with each other. For specific descriptions of the mapping relationship, refer to the following descriptions in S1002.

Figure 10:
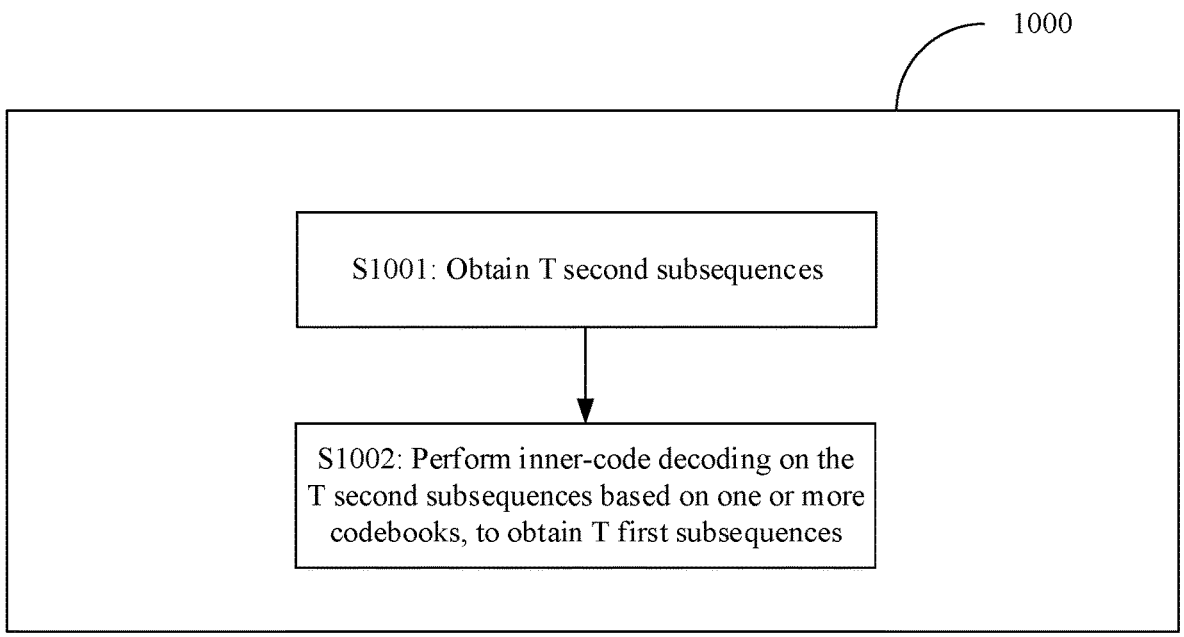
FIG. 10 is a schematic flowchart of a data transmission method 1000 according to an embodiment of this application.

The following describes step 730 in detail. FIG. 10 is a schematic flowchart of a data transmission method 1000 according to an embodiment of this application. As shown in FIG. 10, specific steps are described as follows.

S1001: Obtain T second subsequences.

For example, an inner-code decoder first obtains the T second subsequences. The T second subsequences are generated based on one or more codebooks and T encoding vectors. The T encoding vectors are generated based on T first subsequences. A quantity of non-zero elements in at least one of the T encoding vectors is greater than or equal to 2. The T first subsequences are in a one-to-one correspondence with the T encoding vectors. A location of a non-zero element in a $t_1^{th}$ encoding vector is determined based on a $t_1^{th}$ first subsequence. A length of each of T encoding vectors is equal to M, $t_1 \in [1, T]$, and M, $t_1$, and T are all positive integers.

S1002: Perform inner-code decoding on the T second subsequences based on one or more codebooks, to obtain the T first subsequences.

For example, after obtaining the T second subsequences, the inner-code decoder decodes the T second subsequences.

Specifically, inner-code decoding is performed on the T second subsequences based on the one or more codebooks, to obtain a first sequence, that is, the T first subsequences. Each first subsequence corresponds to the column vector group in the codebook, and a column vector group corresponding to at least one of the T first subsequences includes at least two column vectors.

For example, a column vector group in a codebook $E_{t2}$ corresponding to a $t_2^{th}$ first subsequence is determined by detecting a $t_2^{th}$ second subsequence, and then the $t_2^{th}$ first subsequence is determined based on the column vector group in the codebook $E_{t2}$ corresponding to the $t_2^{th}$ first subsequence. $t_2 \in [1, T]$, $t_2$ is a positive integer, and the codebook $E_{t2}$ is one of the one or more codebooks.

In a possible implementation, a reliability value for measuring existence of some column vectors is obtained through iteration by using a similar related algorithm such as an approximate message passing (AMP) algorithm or a generalized approximate message passing (GAMP) algorithm. When the results measured by these values exceed a preset threshold, it may be considered that the column vector reaches a preset condition. Alternatively, the results measured by these values are sorted, to determine that there is a column vector with highest reliability as the column vector that reaches the preset condition.

Specifically, the $t_2^{th}$ second subsequence is detected, and by using a similar algorithm such as the AMP algorithm or the GAMP algorithm, which column vector in which column vector group in the codebook $E_{t2}$ meets the preset condition is determined, and a column vector group to which the column vector that meets the preset condition belongs is determined as the column vector group in the codebook $E_{t2}$ corresponding to the $t_2^{th}$ first subsequence. The preset condition may be that a reliability value of the column vector in the column vector group is greater than the preset threshold, or it may be considered that the column vector with the highest reliability is the column vector that meets the preset condition. This is not limited herein in this application.

In another possible implementation, a second sequence may be considered as an approximate weighted superposition of some column vectors in the codebook. Therefore, correlation detection may be performed on a received second sequence and all column vectors in the codebook one by one, to obtain a correlation value corresponding to each column vector or a normalized correlation value. The correlation value is used as a numerical measure of reliability of existence of a column vector. When the numerical measurement result of the reliability of the column vector is greater than the preset threshold, it may be considered that the column vector in the column vector group is the column vector that meets the preset condition.

Then, the T first subsequences are determined by using the mapping relationship between the T first subsequences and the column vector group that meets the preset condition and that is in the one or more codebooks.

There are three mapping relationships between the T first subsequences and the codebook. Specific descriptions are as follows.

In a possible implementation, the mapping relationship is that any two column vectors in a column vector group in the codebook corresponding to any two first subsequences do not overlap with each other. Further, each first subsequence meets the mapping relationship with one column vector group in c column vector groups in the codebook. Any column vector group in the c column vector groups includes at least two column vectors, and c is a positive integer. It should be understood that the c column vectors in the codebook mean that the c column vector groups include column vectors in the codebook.

It should be noted that a manner of mapping the at least two column vectors of one column vector group in the codebook to the first subsequence may be predefined and kept consistent between an encoder side and a decoder side according to a standard, or may be kept consistent in a signaling transmission manner, or may be reached by using another method. This is not limited herein in this application.

One first subsequence and the one column vector group in the c column vector groups meet the mapping relationship. The any two column vectors in the two column vector groups corresponding to the any two first subsequences do not overlap with each other. For example, it is assumed that a column vector group that meets the mapping relationship with the $t_1^{th}$ first subsequence is a $t_1^{th}$ column vector group. A column vector group that meets the mapping relationship with the $t_2^{th}$ first subsequence is a $t_2^{th}$ column vector group. Values of the $t_1^{th}$ first subsequence and the $t_2^{th}$ first subsequence are different. In this case, column vectors in the $t_1^{th}$ column vector group and column vectors in the $t_2^{th}$ column vector group do not overlap with each other, and column vectors that do not overlap with each other belong to different column vector groups.

In a possible implementation, one column vector group in the c column vector groups in the codebook is mapped to one first subsequence, c=f(M/g), and f(M/g) is a value obtained by rounding up or rounding down M/g. g is a quantity of column vectors in one column vector group, g∈[1, M], and g is a positive integer. Further, each first subsequence is mapped to the one column vector group in the c column vector groups, has a mapping relationship with only the one first subsequence, and has no mapping relationship with another first subsequence.

For example, M is set to 9, a quantity g of column vectors in one of the c column vector groups is 2, and an operation of rounding down M/g is performed, to obtain that c is equal to 4. One first subsequence is two bits, and in the two-bit first subsequence, different values of the first subsequence represent different manners of mapping column vector groups. In this case, there are four column vector groups that meet the mapping relationship between the one first subsequence and the codebook, and there are two column vectors in each column vector group. For example, a relationship between the one first subsequence and the column vector that meets a mapping condition in the codebook may be shown in Table 1.

TABLE 1

| | Column vector number | | | | | | | | |
|---|---|---|---|---|---|---|---|---|---|
| Value of a first subsequence | 1 | 2 | 3 | 4 | 5 | 6 | 7 | 8 | 9 |
| 00 | ✓ | ✓ | x | x | x | x | x | x | x |
| 01 | x | x | ✓ | ✓ | x | x | x | x | x |
| 10 | x | x | x | x | ✓ | ✓ | x | x | x |
| 11 | x | x | x | x | x | x | ✓ | ✓ | x |

In addition, if it is detected that at least one column vector in one of the c column vector groups that meet the mapping relationship with the one first subsequence meets the preset condition, it may be determined that the first subsequence exists. For example, in Table 1, when it is detected that a column vector whose column vector number is 1 or 2 meets the preset condition, it may be determined that a value of the first subsequence is 00. Therefore, decoding accuracy can be improved, and missed detection can be avoided.

In another possible implementation, the mapping relationship is that at least two column vectors in two column vector groups that meet the mapping relationship with any two first subsequences do not overlap with each other. Further, each first subsequence meets the mapping relationship with one column vector group in c column vector groups in the codebook. Any column vector group in the c column vector groups includes at least two column vectors, and c is a positive integer. It should be understood that the c column vectors in the codebook mean that the c column vector groups include column vectors in the codebook.

It should be noted that a manner of mapping the at least two column vectors of one column vector group in the codebook to the first subsequence may be predefined and kept consistent between an encoder side and a decoder side according to a standard, or may be kept consistent in a signaling transmission manner, or may be kept consistent by using another method. This is not limited herein in this application.

The one first subsequence and the one column vector group in the c column vector groups meet the mapping relationship. The mapping relationship includes that at least two column vectors in two column vector groups in the codebook in which any two first subsequences meet the mapping relationship do not overlap with each other.

In a possible implementation, $c=2^k$, k is a value obtained by rounding up or rounding down $\log_2 p$, $\log_2 p \geq s$, and $p = C_M^b$. s is a length of the one first sequence, b is a quantity of non-zero elements in the encoding vector, $b \in [1, M]$, and both b and s are positive integers.

Optionally, the one first sequence includes an information bit sequence and a check bit sequence. A length of the information bit sequence is h, a length of the check bit sequence is f, s=f+h, h is a positive integer, and f is an integer greater than or equal to 0.

For example, M is set to 5, a quantity b of non-zero elements in the encoding vector is 2, $p = C_2^5 = 10$, and k is a value obtained by rounding down $\log_2 p$ to obtain $k = \log_2 10 = 3$. Therefore, a quantity of column vector groups that meet the mapping relationship in the one first subsequence and the codebook is $2^3 = 8$. In a 2-bit first subsequence, different values of the first subsequence represent different manners of mapping column vector groups. In this case, there are four column vector groups that meet the mapping relationship between the one first subsequence and the codebook, and there are two column vectors in each column vector group. Specifically, a relationship between the one first subsequence and the column vector that meets a mapping condition in the codebook may be shown in Table 2.

TABLE 2

| Value of a first subsequence | Column vector number | | | | |
| --- | --- | --- | --- | --- | --- |
| | 1 | 2 | 3 | 4 | 5 |
| 000 | ✓ | ✓ | x | x | x |
| 001 | ✓ | x | ✓ | x | x |
| 010 | ✓ | x | x | ✓ | x |
| 011 | x | ✓ | ✓ | x | x |
| 100 | x | ✓ | x | x | ✓ |
| 101 | x | x | ✓ | x | ✓ |
| 110 | x | x | x | ✓ | ✓ |
| 111 | ✓ | x | x | x | ✓ |

In addition, if it is detected that all column vectors in one of the c column vector groups that meet the mapping relationship with the one first subsequence meet the preset condition, it may be determined that the first subsequence exists. For example, in Table 2, when it is detected that a column vector whose column vector number is 1 and 3 meets the preset condition, it may be determined that a value of the first subsequence is 001. Therefore, a bit information rate carried in each first subsequence may be increased, codeword space is increased, and simultaneous transmission for more users is supported.

In another possible implementation, the mapping relationship is that any two column vectors in a column vector group in a codebook corresponding to each of first k first subsequences do not overlap with each other. Further, each first subsequence is mapped to a column vector group in c column vector groups, has a mapping relationship with only the first subsequence, and has no mapping relationship with another first subsequence. At least two column vectors in one column vector group corresponding to each of a $(k+1)^{th}$ to a $T^{th}$ first subsequences do not overlap with each other.

For example, each of the T first subsequences meets the mapping relationship with the column vector group that belongs to the c column vector groups in the codebook. $M = M_1 + M_2$, and any two of first k first subsequences meet the mapping relationship. In the codebook, any two column vectors in column vector groups that belong to $c_1$ column vector groups do not overlap with each other. A column vector group in the codebook is mapped to one of the first k first subsequences, $c_1 = f(M_1/g)$, $f(M_1/g)$ is a value obtained by rounding up or rounding down $M_1/g$, g is a quantity of column vectors in the column vector group in the codebook that meets the mapping relationship, $g \in (0, M1]$, and g is an integer. At least two column vectors in column vector groups in $c_2$ column vector groups whose $(k+1)^{th}$ to $T^{th}$ first subsequences meet the mapping relationship do not overlap with each other, $c_2 = 2^k$, and k is a value obtained by rounding up or rounding down $\log_2 p$. In addition, $\log_2 p \geq s$, $p = C_{M_2}^b$, s=f+h, s is a length of the one first sequence, b is a quantity of non-zero elements in the encoding vector, $b \in [0, M2]$, k, b, and s are all positive integers, $c_1$ and $c_2$ are integers greater than or equal to 0, and $c = c_1 + c_2$.

The one first subsequence includes the information bit sequence and the check bit sequence. The length of the information bit sequence is h, the length of the check bit sequence is f, h is a positive integer, and f is an integer greater than or equal to 0.

Specifically, T is 2, $M_1$ is 4, $M_2$ is 5, g is 2, and b is 2. M/g is rounded down, and $\log_2 p$ is rounded down to obtain M=9, where $c_1 = 2$, $c_2 = 8$, and k is 3. Specifically, the relationship between the T first subsequences and the column vectors that meets the mapping condition in the codebook may be shown in Table 3.

TABLE 3

| Value of a first subsequence | | Column vector number | | | | | | | | |
| --- | --- | --- | --- | --- | --- | --- | --- | --- | --- | --- |
| | | 1 | 2 | 3 | 4 | 5 | 6 | 7 | 8 | 9 |
| First first subsequence | 0 | ✓ | x | ✓ | x | x | x | x | x | x |
| | 1 | x | ✓ | x | ✓ | x | x | x | x | x |
| Second first subsequence | 000 | x | x | x | x | x | x | ✓ | x | x |
| | 001 | x | x | x | x | x | ✓ | x | ✓ | x |
| | 010 | x | x | x | x | ✓ | x | x | ✓ | x |
| | 011 | x | x | x | x | x | ✓ | ✓ | x | x |
| | 100 | x | x | x | x | x | x | ✓ | x | ✓ |
| | 101 | x | x | x | x | x | ✓ | x | x | ✓ |
| | 110 | x | x | x | x | x | x | x | ✓ | ✓ |
| | 111 | x | x | x | x | ✓ | x | ✓ | x | x |

It should be noted that a manner of mapping the at least two column vectors of one column vector group in the codebook to the first subsequence may be predefined and kept consistent between an encoder side and a decoder side according to a standard, or may be kept consistent in a signaling transmission manner, or may be reached by using another method. This is not limited herein in this application.

In addition, it is detected that the first k first subsequences meet the mapping relationship. At least one column vector that belongs to one of the $c_1$ column vector groups and that is in the codebook meets the preset condition. The $(k+1)^{th}$ to the $T^{th}$ first subsequences meet the mapping relationship. It is determined that the T first subsequences exist when all column vectors in one of the $c_2$ column vector groups in the codebook meet the preset condition. In other words, when any first subsequence of the first k first subsequences exists in the at least one column vector in all the column vectors in the codebook to which the first subsequence is mapped, it is determined that the first subsequence exists. Therefore, decoding accuracy can be improved, and missed detection can be avoided. When any first subsequence of the $(k+1)^{th}$ to the $T^{th}$ first subsequences exists in all the column vectors in the codebook to which the first subsequence is mapped, it is determined that the first subsequence exists. For example, in Table 3, for the first subsequence, it can be determined that a value of the first subsequence is 1 only when a column vector whose column vector number is 3 or 4 is detected. For the second first subsequence, it can be determined that a value of the first subsequence is 011 only when column vectors whose column vector numbers are 6 and 7 are both detected. Therefore, a bit information rate carried in each first subsequence may be increased, codeword space is increased, and simultaneous transmission for more users is supported, thereby enhancing system flexibility.

The foregoing describes in detail the data transmission method provided in this application with reference to FIG. 1 to FIG. 10. A receive end (or referred to as a decoder side) receives the second sequence from a transmit end (or referred to as an encoder side). It should be understood that this application provides a data transmission method, so that the receive end can perform decoding at a granularity level of T second subsequences instead of performing decoding at a granularity level of bits. In addition, a large quantity of simulation results show that decoding performance is improved. For example, a decoding delay is reduced, and a bit error rate is reduced.

With reference to FIG. 11 to FIG. 17, the following describes a communication apparatus, an encoding apparatus, a network device, and a terminal device that are provided in this application.

Figure 11:
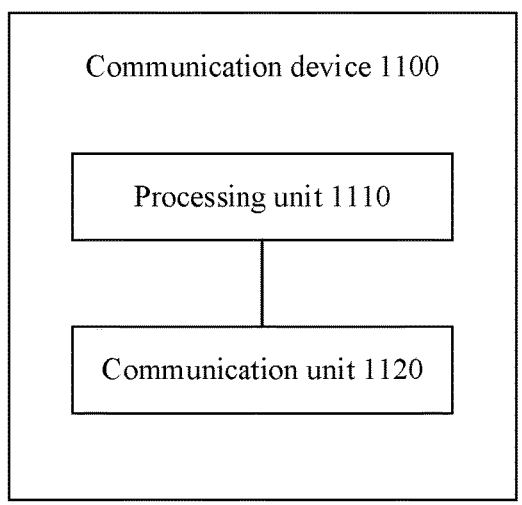
FIG. 11 is a schematic block diagram of a communication apparatus 1100 according to this application.

FIG. 11 is a schematic block diagram of a communication apparatus 1100 according to this application. As shown in FIG. 11, the apparatus 1100 includes a processing unit 1110 and a communication unit 1120.

The processing unit 1110 is configured to: determine T encoding vectors based on T first subsequences; and generate T second subsequences based on one or more codebooks and the T encoding vectors.

The communication unit 1120 is configured to obtain the T first subsequences, and send the T second subsequences generated by the processing unit 1110.

Figure 12:
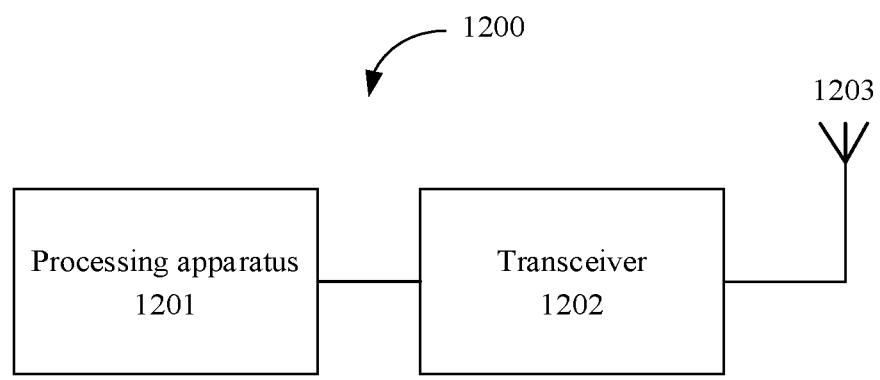
FIG. 12 is a schematic diagram of a structure of a communication apparatus 1200 according to an embodiment of this application.

The communication apparatus 1100 may be configured to perform the data transmission method in embodiments of this application. For a detailed procedure, refer to the description in the foregoing method embodiments. Details are not described herein again. FIG. 12 is a schematic diagram of a structure of a communication apparatus 1200 according to an embodiment of this application. The communication apparatus 1200 is configured to implement an encoding function. The communication apparatus 1200 includes: a processing apparatus 1201, configured to: determine T encoding vectors based on T first subsequences; and generate T second subsequences based on one or more codebooks and the T encoding vectors; and a transceiver 1202, configured to obtain a first sequence and send the T second subsequences.

Optionally, the transceiver is connected to an antenna 1203.

During specific implementation, the processing apparatus 1201 may be a processor, a chip, or an integrated circuit.

This application further provides the processing apparatus 1201, configured to implement the data transmission method in the foregoing method embodiments. Some or all procedures of the data transmission method 800 in embodiments of this application may be implemented by using hardware, or may be implemented by using software. When the data transmission method 800 is implemented by using the hardware, the processing apparatus 1201 may be a processor.

Figure 13:
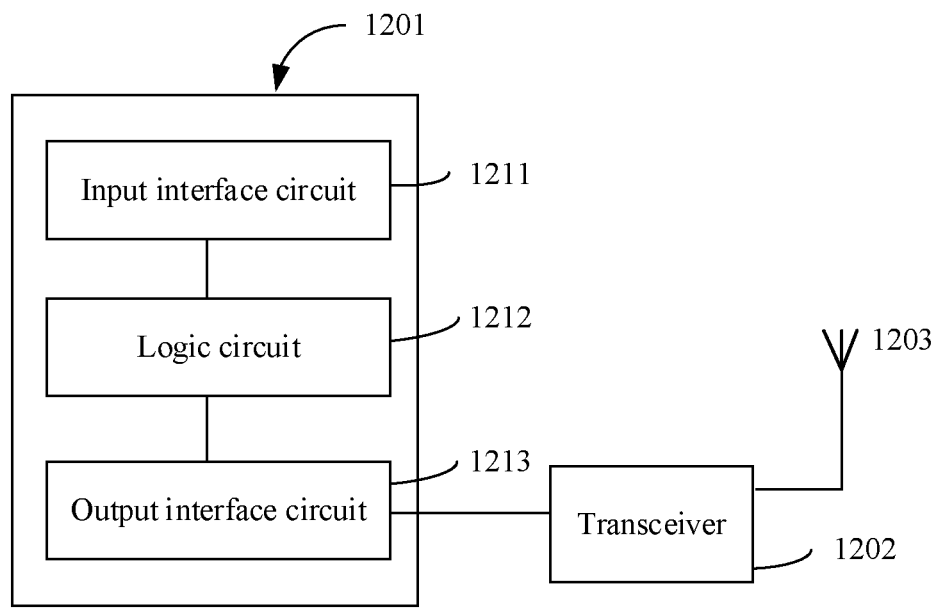
FIG. 13 is a schematic diagram of an internal structure of a processing apparatus 1201 according to this application.

Optionally, when all or some procedures of the data transmission method 800 in this application are implemented by using the hardware, the processing apparatus 1201 may be further shown in FIG. 13. FIG. 13 is a schematic diagram of an internal structure of a processing apparatus 1201. The processing apparatus 1201 includes: an input interface circuit 1211, configured to obtain T first subsequences; a logic circuit 1212, configured to: determine T encoding vectors based on the T first subsequences; and generate T second subsequences based on one or more codebooks and the T encoding vectors; and an output interface circuit 1213, configured to output the T second subsequences.

The logic circuit 1212 may be configured to perform the data transmission method in embodiments of this application. For a detailed procedure, refer to the description in the foregoing method embodiments. Details are not described herein again.

Optionally, some or all procedures of the data transmission method 800 provided in this application may alternatively be implemented by using software. In this case, the processing apparatus 1201 may be a processor. The processor is configured to execute a computer program stored in a memory. When the computer program is executed, the processor performs the data transmission method in the foregoing method embodiments.

Herein, the memory may be a physically independent unit. Alternatively, the memory may be integrated with the processor. This is not limited in this application.

In another optional embodiment, the processing apparatus 1201 may include only the processor. The processor is connected to the memory through a circuit/wire, and is configured to read and execute the computer program stored in the memory. Optionally, the processing apparatus 1201 further includes the memory.

Optionally, when the processing apparatus 1201 is a chip, the chip may further include an input interface and an output interface. The input interface is configured to receive an input first sequence. The output interface is configured to output the T second subsequences.

Based on the data transmission method 1000 provided in this application, this application further provides a communication apparatus 1400. The communication apparatus 1400 is configured to perform the foregoing method 1000.

Figure 14:
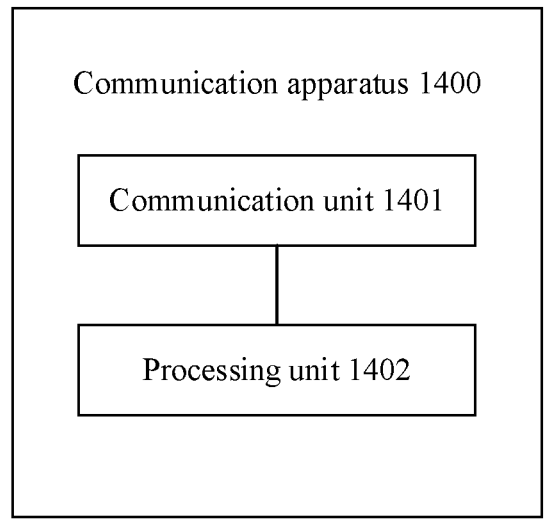
FIG. 14 is a schematic block diagram of a communication apparatus 1400 according to this application.

FIG. 14 is a schematic block diagram of a communication apparatus 1400 according to this application. The communication apparatus 1400 includes a communication unit 1401 and a processing unit 1402.

The communication unit 1401 is configured to receive T second subsequences from a transmit end, where T is a positive integer.

The processing unit 1402 is configured to perform inner-code decoding on the T second subsequences based on one or more codebooks, to obtain T first subsequences.

The communication apparatus 1400 may be configured to perform the data transmission method in embodiments of this application. For a detailed procedure, refer to the description in the foregoing method embodiments. Details are not described herein again.

Figure 15:
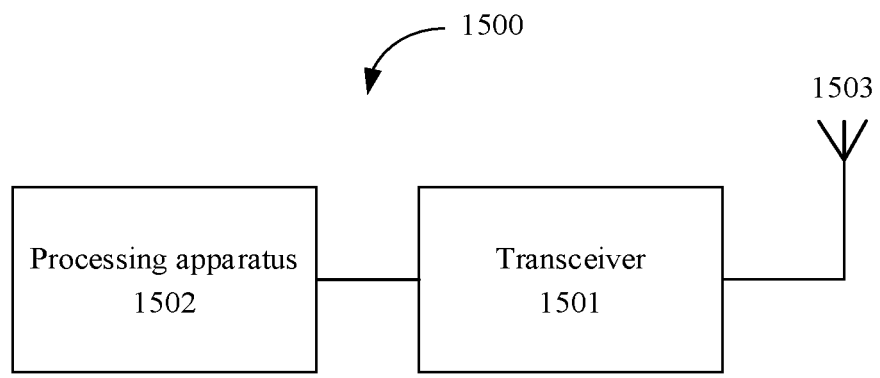
FIG. 15 is a schematic diagram depicting a structure of a communication apparatus 1500 according to an embodiment of this application.

FIG. 15 is a schematic diagram of a structure of a communication apparatus 1500 according to this application. The communication apparatus 1500 is configured to implement a decoding function. The communication apparatus 1500 includes: a transceiver 1501, configured to receive T second subsequences from a transmit end; and a processing apparatus 1502, configured to perform inner-code decoding on the T second subsequences based on one or more codebooks, to obtain T first subsequences.

Optionally, the transceiver 1501 is connected to an antenna 1503.

During specific implementation, the processing apparatus 1502 may be a processor, a chip, or an integrated circuit.

This application further provides the processing apparatus 1502, configured to implement the foregoing decoding method. Some or all procedures of the decoding method in embodiments of this application may be implemented by using hardware, or may be implemented by using software.

Optionally, when the decoding method is implemented by using the hardware, the processing apparatus 1502 may be the processor.

Figure 16:
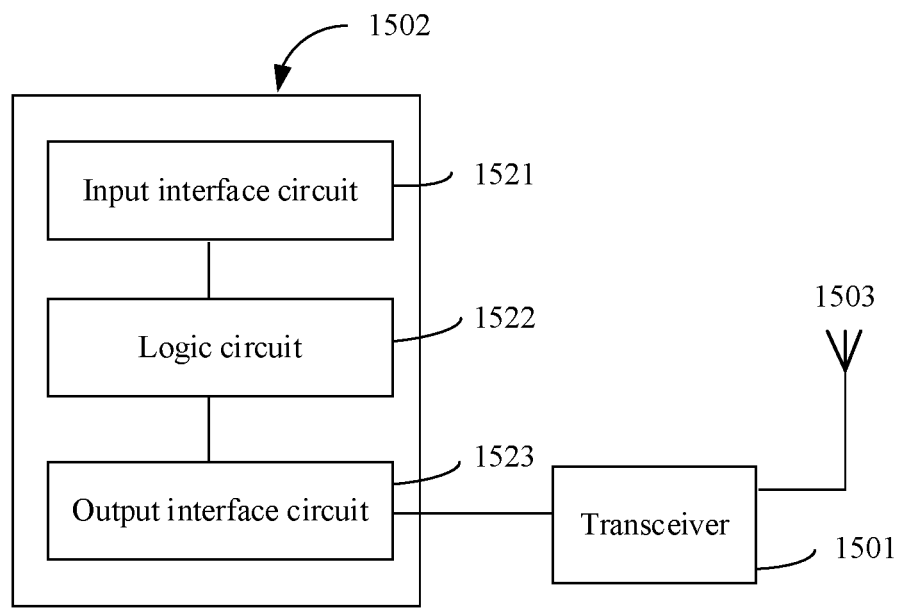
FIG. 16 is a schematic diagram of an internal structure of a processing apparatus 1502 according to this application.

Optionally, when all or some procedures of the decoding method in this embodiment of this application are implemented by using the hardware, the processing apparatus 1502 may be further shown in FIG. 16.

FIG. 16 is a schematic diagram of an internal structure of a processing apparatus 1502. The processing apparatus 1502 includes an input interface circuit 1521, a logic circuit 1522, and an output interface circuit 1523.

The input interface circuit 1521 is configured to obtain T second subsequences.

The logic circuit 1522 is configured to perform inner-code decoding on the T second subsequences based on one or more codebooks, to obtain T first subsequences.

In a possible implementation, the logic circuit 1522 is further configured to perform outer-code decoding on the T first subsequences to obtain an original information sequence.

The output interface circuit 1523 is configured to output the original information sequence.

Optionally, the processing apparatus 1502 may be a processor. The processor is configured to execute a computer program stored in a memory. When the computer program is executed, the processor performs the foregoing decoding method.

Herein, the memory may be a physically independent unit. Alternatively, the memory may be integrated with the processor. This is not limited in this application.

In another optional embodiment, the processing apparatus 1502 includes only the processor. The processor is connected to the memory through a circuit/wire, and is configured to read and execute the computer program stored in the memory. Optionally, the processing apparatus 1502 further includes the memory.

Optionally, when the processing apparatus 1502 is a chip, the chip may further include an input interface and an output interface. The input interface is configured to receive an input to-be-decoded bit sequence. The output interface is configured to output a decoding result.

It should be understood that the data transmission method provided in this application may be performed by a transmit end. For example, in the wireless communication system shown in FIG. 1, when the network device 111 sends a signal, the network device 111 is a transmit end. When any one of the terminal devices 121 to 126 sends a signal, the terminal device is a transmit end. Therefore, this application further provides a network device and a terminal device. The network device and the terminal device have functions of implementing the foregoing data transmission method.

Figure 17:
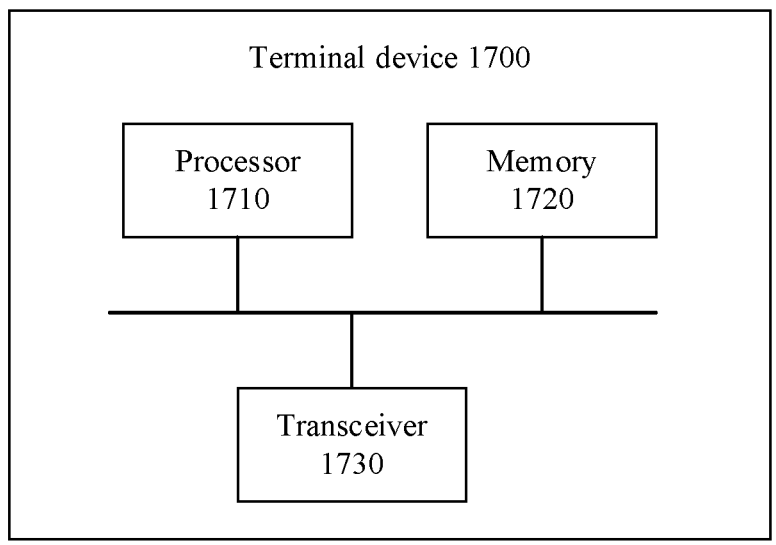
FIG. 17 is a schematic diagram of a structure of a terminal device 1700 according to this application.

FIG. 17 is a schematic diagram of a structure of a terminal device 1700 according to this application. As shown in FIG. 17, as shown in FIG. 17, the terminal device 1700 includes one or more processors 1710, one or more memories 1720, and one or more transceivers 1730. The processor 1710 is configured to control the transceiver 1730 to receive and send a signal. The memory 1720 is configured to store a computer program. The processor 1710 is configured to invoke the computer program from the memory 1720 and run the computer program, to perform a corresponding procedure of the data transmission method 700 provided in this application. For brevity, details are not described herein again.

In addition, this application provides a computer-readable storage medium. The computer-readable storage medium stores computer instructions. When the computer instructions are run on a computer, the computer is enabled to perform a corresponding operation and/or procedure of the data transmission method 700 in embodiments of this application.

This application further provides a computer program product. The computer program product includes computer program code. When the computer program code is run on a computer, the computer is enabled to perform a corresponding operation and/or procedure of the data transmission method in embodiments of this application.

This application further provides a chip including a processor. The processor is configured to read and execute the computer program stored in the memory, to perform a corresponding operation and/or procedure of the data transmission method provided in this application.

Optionally, the chip includes the memory, and the memory and the processor are connected to the memory through a circuit or a wire. Further optionally, the chip further includes a communication interface, and the processor is connected to the communication interface. The communication interface is configured to receive a to-be-encoded bit sequence. The processor obtains an information bit sequence from the communication interface, and performs data processing on the information bit sequence by using the data transmission method in embodiments of this application. The communication interface outputs an encoded bit sequence. The communication interface may be an input/output interface.

This application provides a computer-readable storage medium. The computer-readable storage medium stores computer instructions. When the computer instructions are run on a computer, the computer is enabled to perform a corresponding operation and/or procedure of the data transmission method in embodiments of this application.

This application further provides a computer program product. The computer program product includes computer program code. When the computer program code is run on a computer, the computer is enabled to perform a corresponding operation and/or procedure of the data transmission method in embodiments of this application.

This application further provides a chip including a processor. The processor is configured to read and execute the computer program stored in the memory, to perform a corresponding operation and/or procedure of the data transmission method provided in this application.

Optionally, the chip includes the memory, and the memory and the processor are connected to the memory through a circuit or a wire. Further optionally, the chip further includes a communication interface, and the processor is connected to the communication interface. The communication interface is configured to receive T second subsequences. The processor obtains the T second subsequences from the communication interface, and performs inner-code decoding on the T second subsequences based on one or more codebooks by using the data transmission method 1000 in embodiments of this application, to obtain T first subsequences. The communication interface may be an input/output interface. In an implementation process, steps in the foregoing methods can be implemented by using a hardware integrated logical circuit in the processor, or by using instructions in a form of software. Steps in the foregoing method embodiments may be directly executed and accomplished by using a hardware processor, or may be executed and accomplished by using a combination of hardware and software modules in the processor. A software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor.

The chip in this embodiment of this application may be a field-programmable gate array (FPGA), an application-specific integrated chip (ASIC), a system on chip (SoC), a central processing unit (CPU), a network processor (NP), a digital signal processor (DSP), or may be a microcontroller (MCU), a programmable logic device (PLD), or another integrated chip.

The processor in the embodiments of this application may be an integrated circuit chip, and has a signal processing capability. In an implementation process, steps in the foregoing method embodiments can be implemented by using a hardware integrated logical circuit in the processor, or by using instructions in a form of software. The processor may be a general-purpose processor, a DSP, an ASIC, an FPGA or another programmable logic device, a discrete gate or a transistor logic device, or a discrete hardware component. The general-purpose processor may be a microprocessor, or the processor may be any conventional processor or the like. The steps of the methods disclosed in embodiments of this application may be directly presented as being performed and completed by a hardware encoding processor, or performed and completed by a combination of hardware and a software module in an encoding processor. A software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor.

A memory in embodiments of this application may be a volatile memory or a nonvolatile memory, or may include both a volatile memory and a nonvolatile memory. The nonvolatile memory may be a read-only memory (ROM), a programmable read-only memory (PROM), an erasable programmable read-only memory (EPROM), an electrically erasable programmable read-only memory (electrically EPROM, EEPROM), or a flash memory. The volatile memory may be a random access memory (RAM), used as an external cache. Through example but not limitative description, many forms of RAMs may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchronous link dynamic random access memory (synchlink DRAM, SLDRAM), and a direct rambus dynamic random access memory (direct rambus RAM, DR RAM). It should be noted that the memory of the systems and methods described in this specification includes but is not limited to these and any memory of another proper type.

A person of ordinary skill in the art may be aware that, in combination with units and algorithm steps in the examples described in embodiments disclosed in this specification, the embodiments may be implemented by electronic hardware or a combination of computer software and electronic hardware. This specifically depends on specific applications and design constraints of the technical solutions. A person skilled in the art may use different methods to implement the described functions for each particular application, but it should not be considered that the implementation goes beyond the scope of this application.

The apparatus embodiments described above in this application are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of embodiments of this application.

In addition, functional units in embodiments of this application may be integrated into one processing unit, each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A communication apparatus, comprising:
at least one processor; and
a non-transitory computer readable storage medium storing a program that is executable by the at least one processor, the program including instructions to:
obtain a first sequence, wherein the first sequence comprises T first subsequences, and T is a positive integer;
determine T encoding vectors based on the T first subsequences, wherein a quantity of non-zero elements in at least one encoding vector of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1$ is an element of [1, T], and both $t_1$ and T are positive integers;
generate T second subsequences based on one or more codebooks and the T encoding vectors, wherein each first subsequence of the T first subsequences corresponds to a column vector group in the one or more codebooks, and a column vector group corresponding to at least one first subsequence of the T first subsequences comprises at least two column vectors, wherein any two column vectors in two column vector groups corresponding to any two first subsequences do not overlap with each other; and
send the T second subsequences.

2. The apparatus according to claim 1, wherein the program includes instructions to:
obtain a $t_2^{th}$ second subsequence by multiplying a codebook $E_{t2}$ by a $t_2^{th}$ encoding vector, wherein the codebook $E_{t2}$ is a matrix with n rows and M columns, the $t_2^{th}$ encoding vector is determined based on a $t_2^{th}$ first subsequence, a length of the $t_2^{th}$ encoding vector is equal to M, $t_2$ is an element of [1, T], $t_2$, n, and M are all positive integers, and the codebook $E_{t2}$ is a codebook of the one or more codebooks.

3. The apparatus according to claim 1, wherein one column vector group in the codebook corresponding to each first subsequence of the T first subsequences is one of c column vector groups, c is a value obtained by rounding up or rounding down M/g, g is a quantity of column vectors in the one column vector group, M is a quantity of columns in the codebook, and g is an integer greater than or equal to 1 and less than or equal to M.

4. The apparatus according to claim 1, wherein one column vector group in the codebook corresponding to each of the T first subsequences is one of c column vector groups, $c=2^k$, k is a value obtained by rounding up or rounding down $\log_2 p$, p is equal to $C_M^b$, b is a quantity of column vectors in the one column vector group, M is a quantity of columns in the codebook, and b is an integer greater than or equal to 1 and less than or equal to M.

5. The apparatus according to claim 1, wherein the program further includes instructions to:
before obtaining the first sequence, perform outer-code encoding on an original information sequence to generate the first sequence.

6. The communication apparatus according to claim 1, wherein the column vectors that do not overlap with each other enable decoding of the T second subsequences at a subsequence level.

7. The communication apparatus according to claim 1, wherein the column vector group corresponding to the at least one first subsequence comprises exactly two column vectors.

8. The communication apparatus according to claim 1, wherein the first sequence comprises a length h information bit sequence and a length f check bit sequence, where h is a positive integer and f is an integer greater than or equal to 0.

9. A communication apparatus, comprising:
at least one processor; and
a non-transitory computer readable storage medium storing a program that is executable by the at least one processor, the program including instructions to:
obtain T second subsequences, wherein the T second subsequences are generated based on one or more codebooks and T encoding vectors, the T encoding vectors are generated based on T first subsequences, a quantity of non-zero elements in at least one encoding vector of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1$ is an element of [1, T], and both $t_1$ and T are positive integers, wherein any two column vectors in two column vector groups corresponding to any two first subsequences do not overlap with each other; and
perform inner-code decoding on the T second subsequences based on the one or more codebooks, to obtain the T first subsequences, wherein each first subsequence corresponds to one column vector group in the one or more codebooks, and a column vector group corresponding to at least one first subsequence of the T first subsequences comprises at least two column vectors.

10. The apparatus according to claim 9, wherein the program includes instructions to:
determine, by detecting a $t_2^{th}$ second subsequence, one column vector group in a codebook $E_{t2}$ corresponding to a $t_2^{th}$ first subsequence, wherein $t_2$ is an element of [1, T], $t_2$ is a positive integer, and the codebook $E_{t2}$ is a codebook of the one or more codebooks; and
determine the $t_2^{th}$ first subsequence based on the one column vector group in the codebook $E_{t2}$ corresponding to the $t_2^{th}$ first subsequence.

11. The apparatus according to claim 10, wherein the program includes instructions to:
detect the $t_2^{th}$ second subsequence, and when at least one column vector in one column vector group meets a preset condition, determine that the one column vector group is the one column vector group in the codebook $E_{t2}$ corresponding to the $t_2^{th}$ first subsequence.

12. The apparatus according to claim 10, wherein the program further includes instructions to:
detect the $t_2^{th}$ second subsequence, and when any column vector in one column vector group meets a preset condition, determine that the one column vector group is the one column vector group in the codebook $E_{t2}$ corresponding to the $t_2^{th}$ first subsequence.

13. The apparatus according to claim 10, wherein the program includes instructions to:
detect the T second subsequences, and when at least one column vector in $T_1$ column vector groups meets a preset condition and any column vector in $T_2$ column vector groups meets a preset condition, determine that the column vector group is a column vector group in a codebook corresponding to the T first subsequences, wherein $T=T_1+T_2$.

14. The apparatus according to claim 9, wherein one column vector group in the codebook corresponding to each of the T first subsequences is one of c column vector groups, c is a value obtained by rounding up or rounding down M/g, g is a quantity of column vectors in the one column vector group, M is a quantity of columns in the codebook, and g is an integer greater than or equal to 1 and less than or equal to M.

15. The apparatus according to claim 9, wherein one column vector group in the codebook corresponding to each of the T first subsequences is one of c column vector groups, $c=2^k$, k is a value obtained by rounding up or rounding down $\log_2 p$, p is equal to $C_M^b$, b is a quantity of column vectors in the one column vector group, M is a quantity of columns in the codebook, and b is an integer greater than or equal to 1 and less than or equal to M.

16. The apparatus according to claim 9, wherein the program further includes instructions to:
perform outer-code decoding on the T first subsequences to obtain an original information sequence.

17. A communication system, comprising:
a transmit end device; and
a received end device;
wherein the transmit end device is configured to:
obtain a first sequence, wherein the first sequence comprises T first subsequences, and T is a positive integer;
determine T encoding vectors based on the T first subsequences, wherein a quantity of non-zero elements in at least one encoding vector of the T encoding vectors is greater than or equal to 2, the T first subsequences are in a one-to-one correspondence with the T encoding vectors, a location of a non-zero element in a $t_1^{th}$ encoding vector in the T encoding vectors is determined based on a $t_1^{th}$ first subsequence, $t_1$ is an element of [1, T], and both $t_1$ and T are positive integers;
generate T second subsequences based on one or more codebooks and the T encoding vectors, wherein each first subsequence of the T first subsequences corresponds to a column vector group in the one or more codebooks, and a column vector group corresponding to at least one first subsequence of the T first subsequences comprises at least two column vectors, wherein any two column vectors in two column vector groups corresponding to any two first subsequences do not overlap with each other; and
send the T second subsequences; and
wherein the received end device is configured to:
obtain the T second subsequences; and
perform inner-code decoding on the T second subsequences based on the one or more codebooks, to obtain the T first subsequences.

18. The communication system according to claim 17, wherein the column vectors that do not overlap with each other enable decoding of the T second subsequences at a subsequence level.

* * * * *